US012672306B2

(12) United States Patent
Huang et al.

(10) Patent No.: US 12,672,306 B2
(45) Date of Patent: Jun. 30, 2026

(54) SEMICONDUCTOR DEVICE AND METHOD OF FORMING THE SAME

(71) Applicant: TAIWAN SEMICONDUCTOR MANUFACTURING COMPANY, LTD., Hsinchu (TW)

(72) Inventors: Yu-Lien Huang, Hsinchu County (TW); Tze-Liang Lee, Hsinchu City (TW); Jr-Hung Li, Hsinchu County (TW); Chi-Hao Chang, Taoyuan City (TW); Hao-Yu Chang, Taipei City (TW); Pei-Yu Chou, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 771 days.

(21) Appl. No.: 17/886,215

(22) Filed: Aug. 11, 2022

(65) Prior Publication Data

US 2024/0055525 A1     Feb. 15, 2024

(51) Int. Cl.
| | |
|---|---|
| *H10D 30/62* | (2025.01) |
| *H10D 30/01* | (2025.01) |
| *H10D 64/01* | (2025.01) |

(52) U.S. Cl.
CPC ....... *H10D 30/6211* (2025.01); *H10D 30/024* (2025.01); *H10D 64/01* (2025.01); *H10D 64/017* (2025.01)

(58) Field of Classification Search
CPC ......... H01L 21/76883; H01L 21/76885; H01L 23/485; H01L 23/5226; H10D 30/024; H10D 30/62; H10D 30/6211; H10D 30/6219; H10D 62/82; H10D 62/822; H10D 64/01; H10D 64/017; H10D 84/0158; H10D 84/038

See application file for complete search history.

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |

(Continued)

*Primary Examiner* — Matthew C Landau
*Assistant Examiner* — Dmitriy Yemelyanov
(74) *Attorney, Agent, or Firm* — Maschoff Brennan

(57) ABSTRACT

A method of forming a semiconductor device includes forming a dummy gate structure across a fin protruding from a substrate, forming gate spacers on opposite sidewalls of the dummy gate structure, forming source/drain epitaxial structures on opposite sides of the dummy gate structure, forming a first interlayer dielectric (ILD) layer on the source/drain epitaxial structures and outer sidewalls of the gate spacers, replacing the dummy gate structure with a replacement gate structure, etching back the replacement gate structure to form a first recess between the gate spacers, forming a source/drain contact in the first ILD layer, and forming a second interlayer dielectric (ILD) layer to fill in the first recess between the gate spacers and over the source/drain contact.

20 Claims, 30 Drawing Sheets

(56) References Cited

U.S. PATENT DOCUMENTS

| | | | |
|---|---|---|---|
| 9,831,183 | B2 | 11/2017 | Lin et al. |
| 9,859,386 | B2 | 1/2018 | Ho et al. |
| 2012/0139061 | A1* | 6/2012 | Ramachandran ...... H10D 30/60 |
| | | | 438/586 |
| 2016/0172300 | A1* | 6/2016 | Lu ..................... H01L 21/76805 |
| | | | 257/786 |
| 2018/0175201 | A1* | 6/2018 | Wang ................... H10D 30/024 |
| 2019/0164751 | A1* | 5/2019 | Chi ...................... H10D 64/519 |
| 2019/0378722 | A1* | 12/2019 | Economikos .......... H10D 30/62 |
| 2020/0135550 | A1* | 4/2020 | Chen ..................... H10D 30/62 |

* cited by examiner

10b 142
124
122
102
100

120
126
160
118
120
140

SEMICONDUCTOR DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
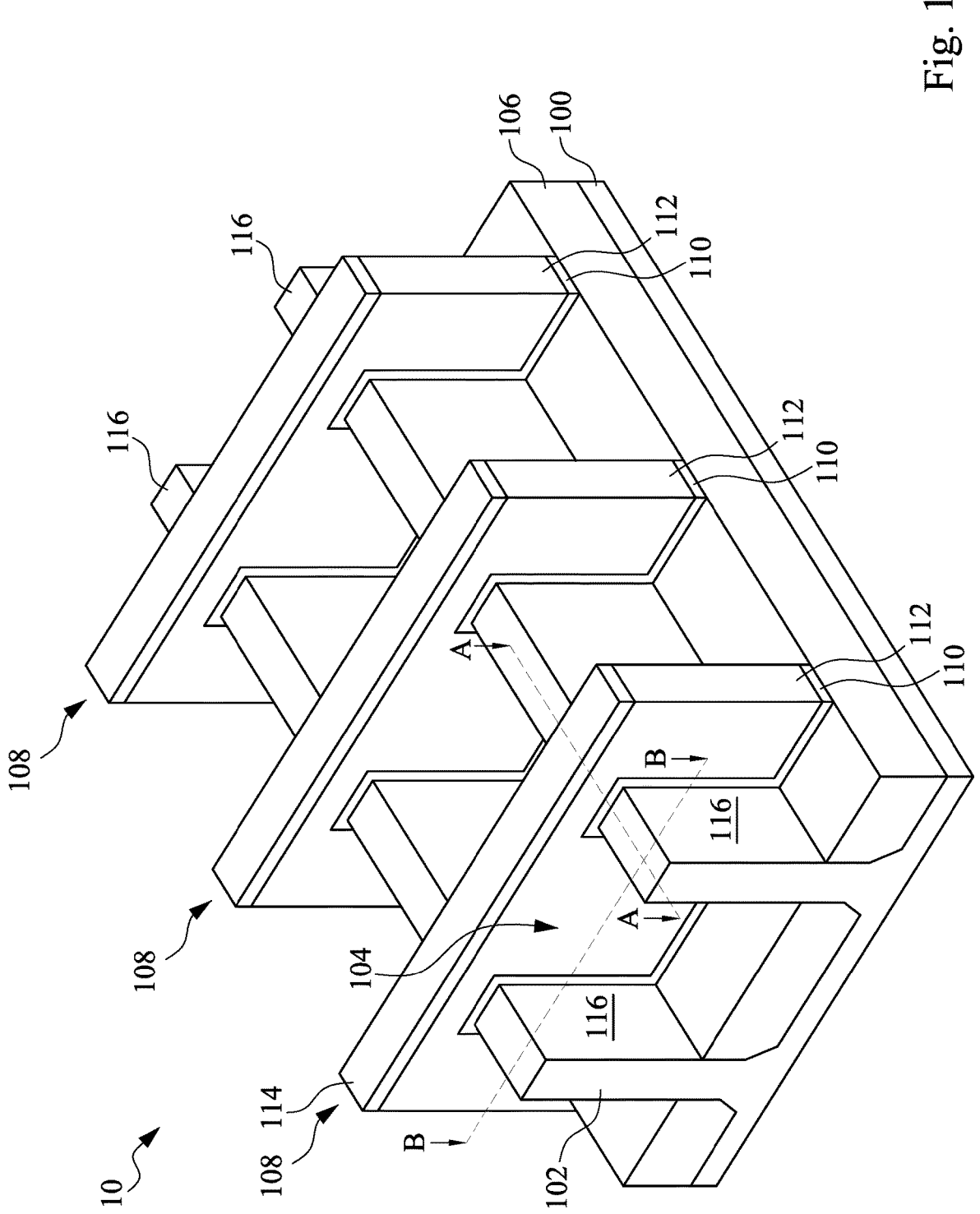
FIG. 1 illustrates a perspective view of an example of the semiconductor device in a three-dimensional view corresponding to a stage of fabrication according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in contact, and may also include embodiments in which additional features may be formed between the first and second features, such that the first and second features may not be in contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as fin field-effect transistor (FinFET) devices. Such a device may include a P-type metal-oxide-semiconductor FinFET device or an N-type metal-oxide-semiconductor FinFET device. The Fin-FET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate ($\Omega$-gate) devices, or Pi-gate ($\Pi$-gate) devices.

FIG. 1 illustrates an example of an intermediate structure of an integrated circuit (IC) structure 10 in a three-dimensional view. FIG. 1 also illustrates reference cross-sections that is used in later figures. Fins 102 are formed on a semiconductor substrate 100. The fins extend in a first direction D1 above the semiconductor substrate 100. The semiconductor substrate 100 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 100 may include an elemental semiconductor including silicon (Si) or germanium (Ge); a compound semiconductor; an alloy semiconductor; or a combination thereof. Each fin 102 provides an active area where one or more devices are formed. The fins 102 are fabricated using suitable processes performed on the semiconductor substrate 100, including masking, photolithography, and/or etch processes, to form trenches 104 into the semiconductor substrate 100, leaving the fins extended upward from the semiconductor substrate 100. The fins 102 may be patterned by any suitable method. For example, the fins 102 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 102 and form the trenches 104.

The trenches 104 may then be filled with an insulating material such as an oxide (e.g., silicon oxide), a nitride, the like, or a combination thereof. The insulating material may be recessed, such as by using an acceptable etch process, to form the isolation regions 106. The insulating material is recessed such that the fins 102 protrude above and from between neighboring isolation regions 106.

Dummy gate structures 108 are formed on the fins 102. The dummy gate structures 108 are over and extend perpendicularly to the fins 102. For example, the dummy gate structures 108 extend in a second direction D2 substantially perpendicular to the first direction D1. Each dummy gate structure 108 includes an interfacial dielectric 110, a dummy gate 112 over the interfacial dielectric 110, and a mask 114 over the dummy gate 112. The interfacial dielectrics 110, the dummy gates 112, and the mask 114 for the dummy gate structures 108 may be formed by sequentially forming respective layers, and then patterning those layers into the dummy gate structures 108. For example, a layer for the interfacial dielectrics 110 may include or be silicon oxide, silicon nitride, the like, or multilayers thereof. A layer for the dummy gates 112 may include or be silicon (e.g., polysilicon) or another material. A layer for the masks 114 may include or be silicon nitride, silicon oxynitride, silicon carbon nitride, the like, or a combination thereof. The layers can be formed or deposited by any suitable deposition technique. The layers for the interfacial dielectrics 110, the dummy gates 112, and the mask 114 may then be patterned, for example, using photolithography and one or more etch processes, to form the interfacial dielectrics 110, the dummy gates 112, and the mask 114 for each dummy gate structure 108. In some embodiments, the dummy gate structure 108 has a width in a range from 10 nm to 100 nm.

Figure 2:
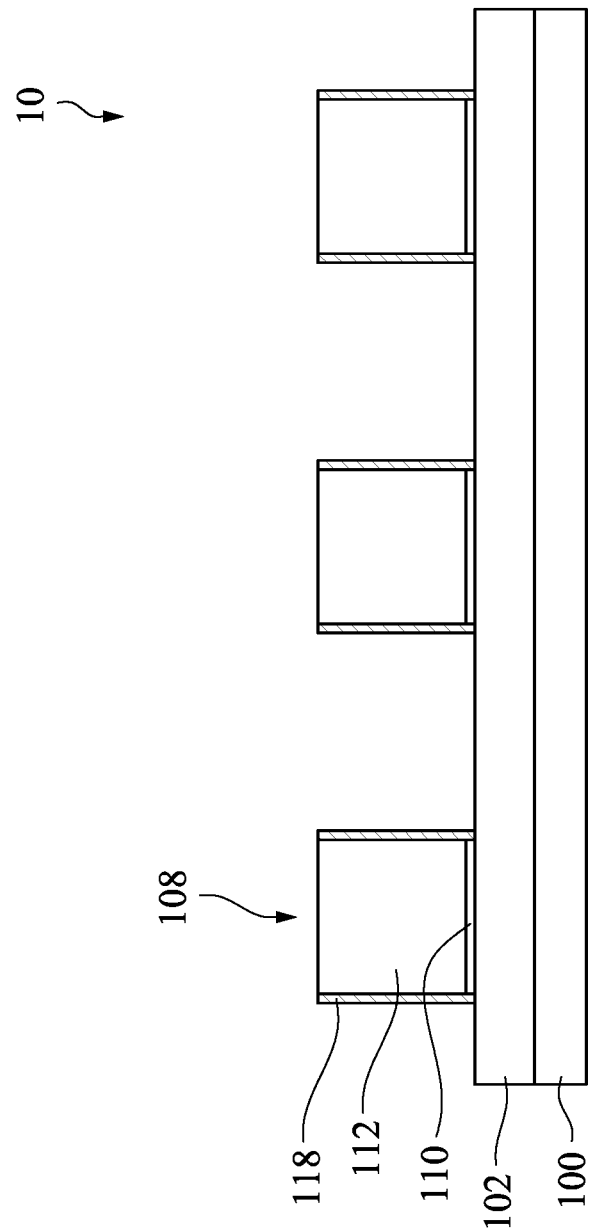
FIGS. 2, 3A, 4A and 5-11 are schematic cross-sectional views of respective intermediate structures corresponding to various stages of fabrication and corresponding to cross-section A-A in FIG. 1.
Figure 3A:
Figure 3A:
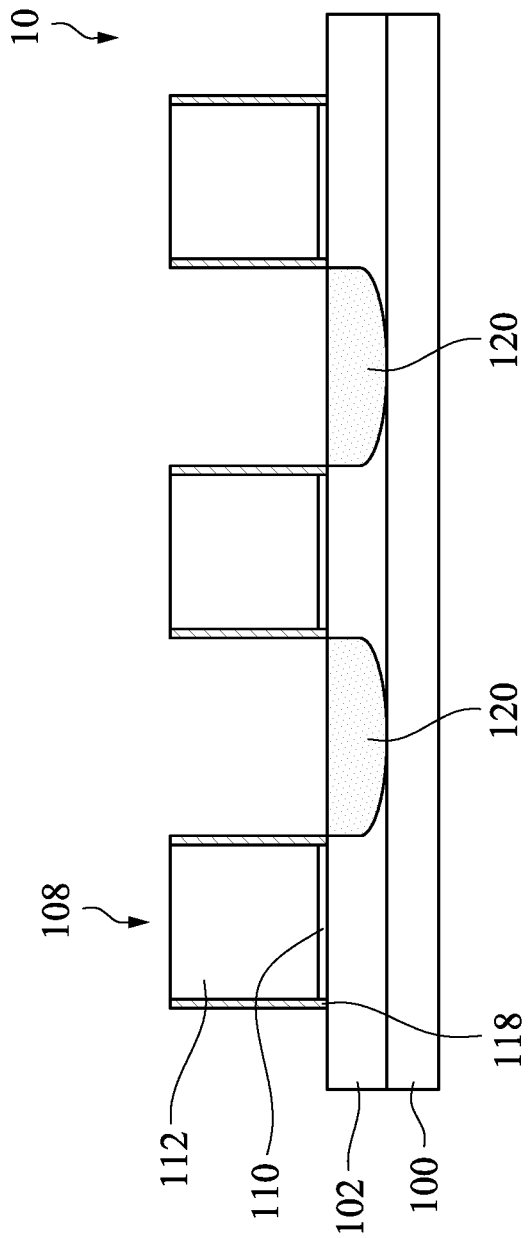
Figure 3B:
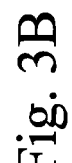
FIGS. 3B and 4B are schematic cross-sectional views of respective intermediate structures corresponding to various stages of fabrication and corresponding to cross-section B-B in FIG. 1.
Figure 3B:
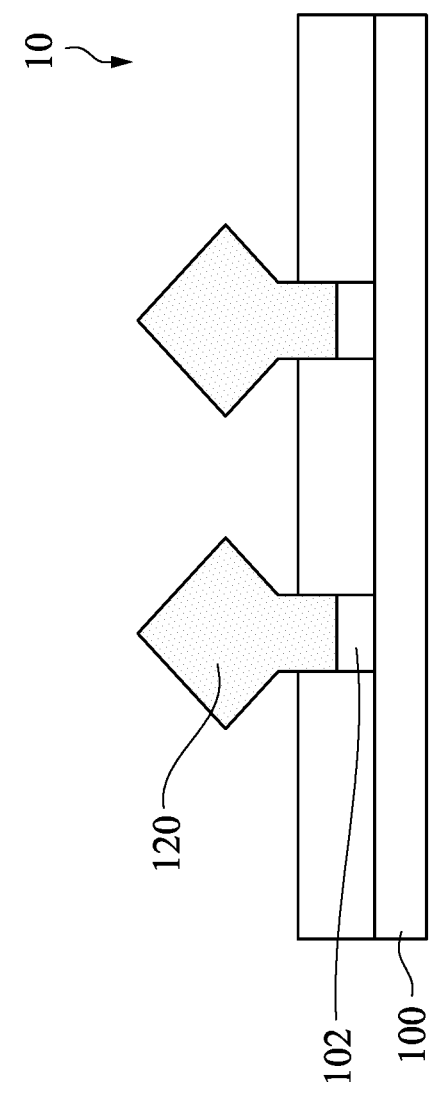

FIGS. 2, 3A, 4A, and 5-11 are schematic cross-sectional views of respective intermediate structures of various stages of fabricating the integrated circuit (IC) structure 10 corresponding to cross-section A-A in FIG. 1. Cross-section A-A in FIG. 1 is in a plane along, e.g., channels in the fin 102 between opposing source/drain regions 116. FIGS. 3B and 4B are schematic cross-sectional views of respective intermediate structures corresponding to various stages of fabrication and corresponding to cross-section B-B in FIG. 1. Cross-section B-B is in a plane perpendicular to cross-section A-A and is across the source/drain regions 116.

FIG. 2 illustrates gate spacers 118 formed along sidewalls of the dummy gate structures 108 (e.g., sidewalls of the interfacial dielectrics 110 and dummy gates 112) and over the fins 102. The gate spacers 118 may be formed by conformally depositing one or more layers for the gate spacers 118 and anisotropically etching the one or more layers, for example. The one or more layers for the gate spacers 118 may include a material different from the material(s) for the dummy gate structure 108. In some embodiments, the gate spacer 118 may include or be a dielectric material, such as silicon nitride, silicon oxynitride, silicon carbon nitride, the like, multi-layers thereof, or a combination thereof, and may be deposited by any suitable deposition technique. In some embodiments, the gate spacers 118 has a width in a range from 2 nm to 10 nm.

After the gate spacers 118 are formed, exposed fins 102 are recessed to form recesses, for example, by dry etching process, wet etching process, and/or combination thereof, and then source/drain epitaxial structures 120 are formed in the recesses in the fins 102. The resulting structure is shown in FIGS. 3A-3B. The dummy gate structure 108 is adjacent the source/drain epitaxial structures 120.

In various embodiments, the source/drain epitaxial structures 120 may include Ge, Si, GaAs, AlGaAs, SiGe, GaAsP, SiP, or other suitable material. In some embodiments, the source/drain epitaxial structures 120 may be in-situ doped during the epitaxial process. In some embodiments, the source/drain epitaxial structures 120 are not in-situ doped, and, for example, instead an implantation process is performed to dope the epitaxially grown the source/drain epitaxial structures 120. Although the source/drain epitaxial structures 120 illustrated in FIGS. 3A and 3B are formed by etching recesses in the fins 102 and then epitaxially growing semiconductor materials in the recesses in the fins 102, the source/drain epitaxial structures 120 in some other embodiments can be formed without recessing the fins 102. In that case, the source/drain epitaxial structures 120 would be formed to wrap around at least three sides of the fins 102.

Figure 4A:
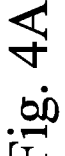
Figure 4A:
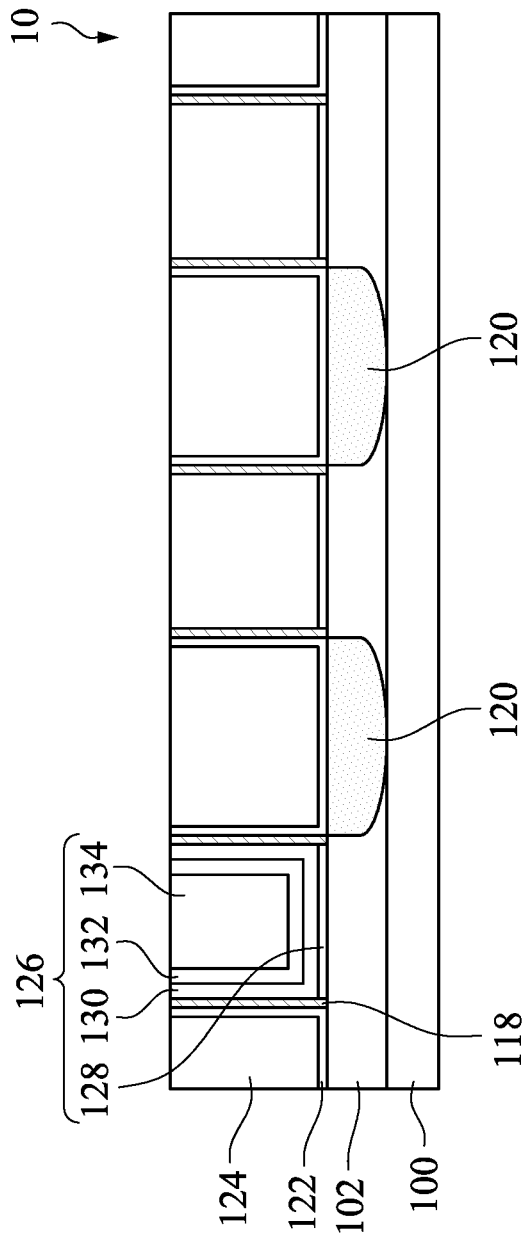
Figure 4B:
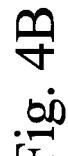
Figure 4B:
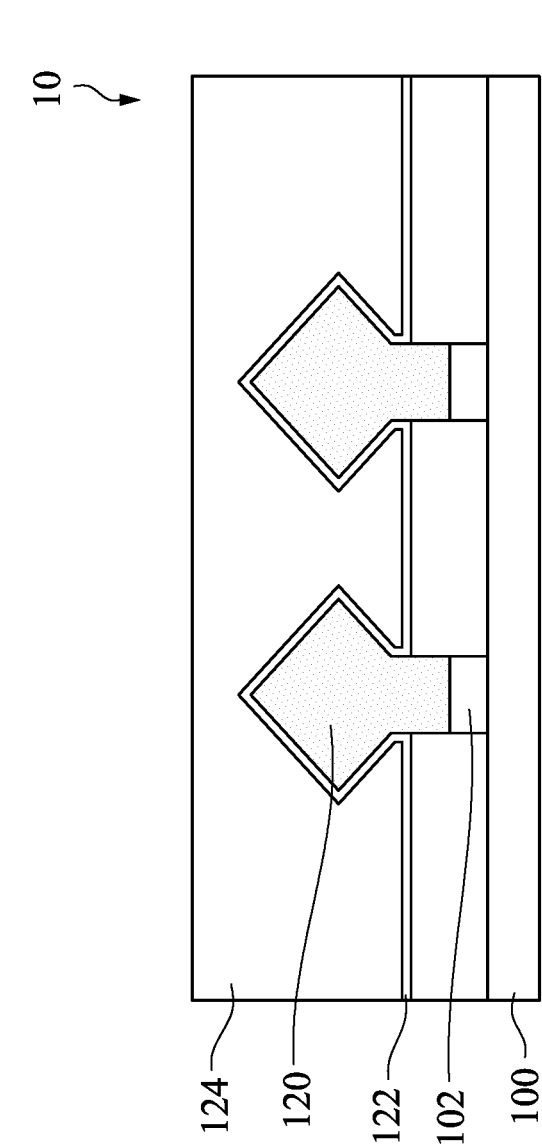

Referring to FIGS. 4A-4B, a contact etch stop layer (CESL) 122 and a first interlayer dielectric (ILD) layer 124 are sequentially formed on surfaces of the source/drain epitaxial structures 120, outer sidewalls and top surfaces of the gate spacers 118, and top surfaces of the isolation regions 106 using any suitable deposition technique. In some embodiments, the first ILD layer 124 has a width in a range from 10 nm to 100 nm. The CESL 122 is deposited conformally and may include or be silicon nitride, silicon carbon nitride, carbon nitride, the like, or a combination thereof. In some embodiments, the CESL 122 has a thickness in a range from 2 nm to 10 nm. The first ILD layer 124 may include or be tetraethylorthosilicate (TEOS) oxide, silicon dioxide, a low-k dielectric material (e.g., a material having a dielectric constant lower than silicon dioxide), or the like. A chemical mechanical planarization (CMP) process may then be performed to planarize the first ILD layer 124 and the CESL 122 and to remove the dummy gate structures 108, thereby leveling the top surface of the first ILD layer 124 and CESL 122 with the top surfaces of the dummy gate structures 108.

The dummy gate structures 108 are then removed using one or more etch processes. Upon removal of the dummy gate structures 108, recesses are formed between the gate spacers 118 where the dummy gate structures 108 are removed, and channel regions of the fins 102 are exposed through the recesses. Replacement gate structures 126 are then formed in the recesses where the dummy gate structures 108 were removed, as shown in FIG. 4A. The replacement gate structure 126 may include an interfacial dielectric 128, a gate dielectric layer 130, one or more optional conformal layers 132, and a gate fill conductive material 134. The interfacial dielectric 128 is formed on top surfaces of the fins 102 along the channel regions. The interfacial dielectric 128 can be an oxide (e.g., silicon oxide) formed by thermal or chemical oxidation of the fin 102, and/or an oxide (e.g., silicon oxide), nitride (e.g., silicon nitride), and/or another dielectric layer using any suitable deposition technique.

The gate dielectric layer 130 can be conformally deposited in the recesses where the dummy gate structures 108 were removed (e.g., on the interfacial dielectric 128, and sidewalls of the gate spacers 118) and on the top surfaces of the first ILD layer 124, the CESL 122, and the gate spacers 118. The gate dielectric layer 130 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 132 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A gate fill conductive material 134 is formed over the one or more conformal layers 132, if implemented, and/or the gate dielectric layer 130. The gate fill conductive material 134 can fill remaining recesses where the dummy gate structures 108 were removed. The gate fill conductive material 134 may be or include a metal-containing material such as tungsten, cobalt, aluminum, ruthenium, copper, multi-layers thereof, a combination thereof, or the like.

A planarization process, like a CMP, may remove portions of the gate fill conductive material 134, the one or more conformal layers 132, and the gate dielectric layer 130 above the top surfaces of the first ILD layer 124, the CESL 122, and the gate spacers 118. The replacement gate structures 126, each including the gate fill conductive material 134, the one or more conformal layers 132, the gate dielectric layer 130, and the interfacial dielectric 128, may therefore be formed as illustrated in FIG. 4A. For simplicity, the interfacial dielectric 128, the gate dielectric layer 130, the one or more optional conformal layers 132, and the gate fill conductive material 134 are not shown in subsequent drawings.

Figure 5:
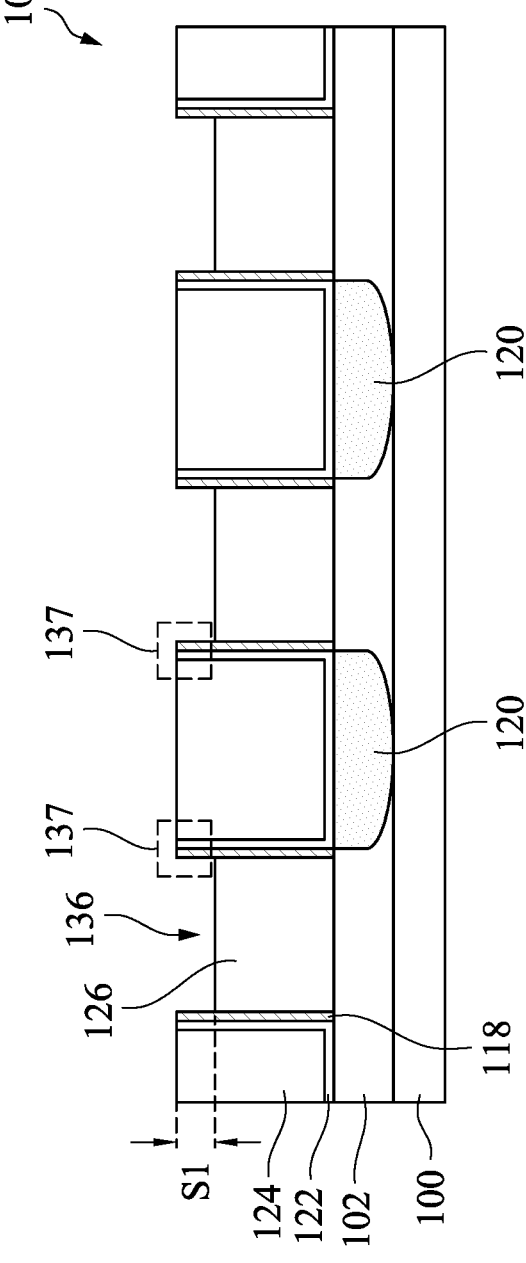

In FIG. 5, the replacement gate structures 126 are recessed in an etching step(s), so that recesses 136 are formed. The recesses 136 allow for subsequently formed hard mask material to be formed within the recesses 136 to protect the replacement gate structures 126 during subsequent processes. The recesses 136 are defined by the exposed inner surfaces of the gate spacers 118 and the recessed top surfaces of the replacement gate structures 126, respectively. The replacement gate structures 126 can be etched back by a vertical dimension S1 along a Z-axis from the top surface of replacement gate structures 126. In some embodiments, the vertical dimension S1 is in a range from 10 nm to 80 nm. The gate spacers 118 and the CESL 122 have top portions higher than the top surface of the replacement gate structure 126. Top portions of the gate spacers 118 and the CESL 122 can be collectively referred to as a wing part 137. In some embodiments, the replacement gate structure 126 has a height in a range from 10 nm to 50 nm.

Figures 6, 7:
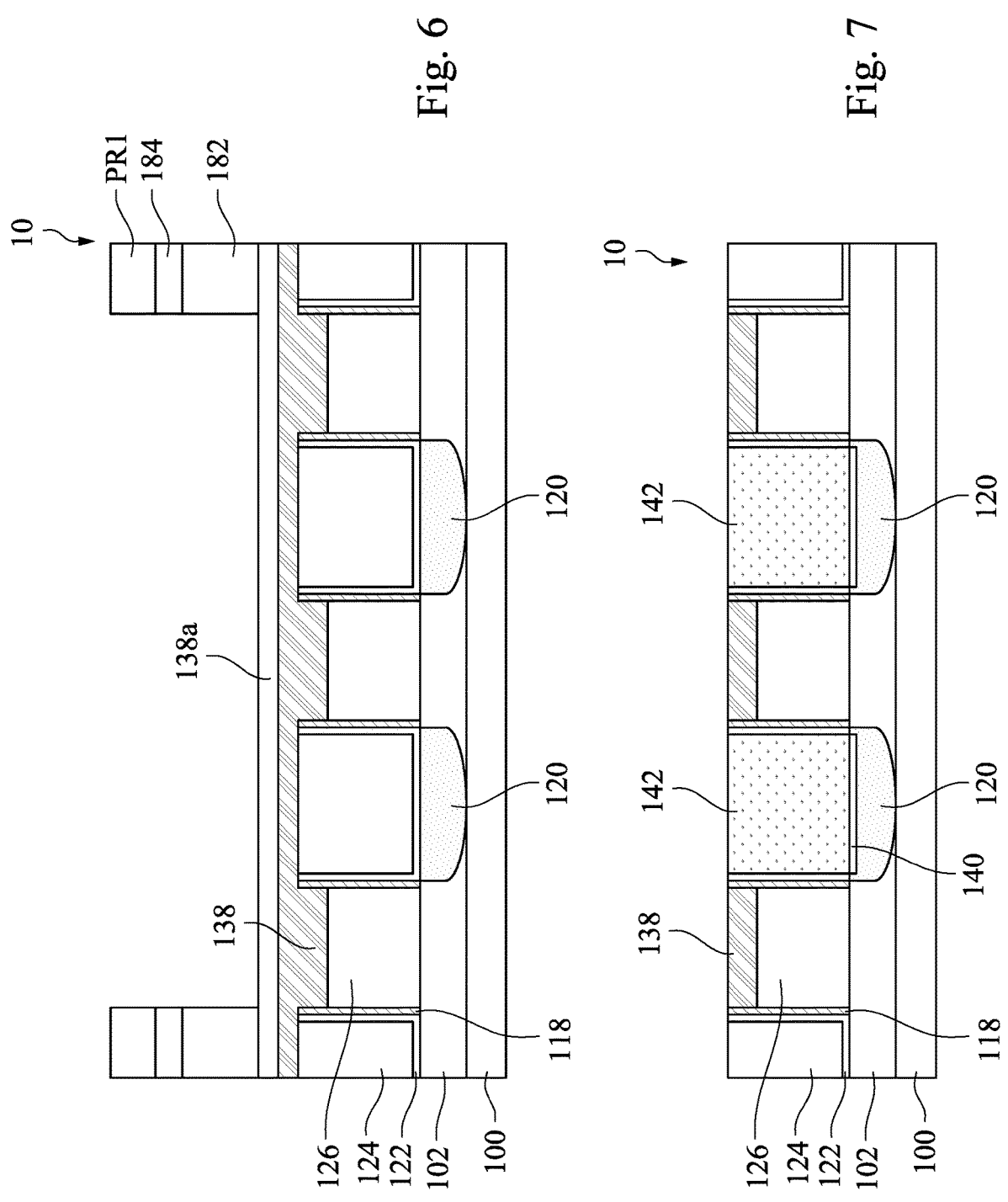

In FIG. 6, a hard mask layer 138 is formed over the first ILD layer 124 and within the recesses 136 over the replacement gate structures 126 to protect the replacement gate structures 126 during subsequent processes. Here, the hard mask layer 138 and the first ILD layer 124 are made of different insulating materials. For example, the hard mask layer 138 is made of materials having a high etch selectivity with respect to the first ILD layer 124. Therefore, the first ILD layer 124 can be selectively removed in a self-aligned manner.

In some embodiments, the hard mask layer 138 includes $SiO_2$, SiCN, SiON, SiN, $Al_2O_3$, $La_2O_3$, SiN, a combination thereof, or the like, but other suitable dielectric films may be used. In one embodiment, the hard mask layer 138 is made of SiN, and the first ILD layer 124 is made of $SiO_2$. The hard mask layer 138 may be formed using, for example, atomic layer deposition (ALD), plasma enhanced atomic layer deposition (ALD), chemical vapor deposition (CVD), physical vapor deposition (PVD), spin-on-glass, or the like. Other suitable process steps may be used. A planarization process, like a CMP, may remove portions of the hard mask layer 138 above the top surfaces of the first ILD layer 124, the CESL 122, and the gate spacers 118.

Then, an MD hard mask 138a may be formed on the first ILD layer 124, the gate spacers 118 and the CESL 122. The MD hard mask 138a may be a single layer or a multi-layer structure, and may be formed using CVD. A tri-layer mask including a bottom layer 182, a middle layer 184 and a photoresist PR1 may be spin coated on the MD hard mask 138a. The tri-layer stack is then patterned, and the MD hard mask 138a will then be patterned by the tri-layer mask to form openings exposing the first ILD layer 124 over the source/drain epitaxial structures 120. The exposed first ILD layer 124 is removed by an etching process. After etching, the tri-layer mask (e.g., the bottom layer 182, the middle layer 184 and the patterned photoresist PR1) and the MD hard mask 138a are removed, such as by an acceptable ashing or stripping process.

Silicide regions 140 are formed by a process that includes depositing a metal layer, such as titanium, cobalt, nickel, tungsten, or the like, over the device, including the exposed surfaces of the source/drain epitaxial structures 120 and then annealing the metal layer such that the metal layer is able to react with the source/drain epitaxial structures 120 to form silicide regions 140, and removing the non-reacted metal layer. Afterwards, a conductive material is deposited, in which a single layer or a multilayer (including a plurality of conductive layers) is formed. Next, a planarization step such as CMP is performed to remove excess material of the conductive material, to planarize the top surface of the IC structure 10. The remaining portion of the conductive material refers to source/drain contacts 142. A resulting structure is shown in FIG. 7.

Figures 8, 9:
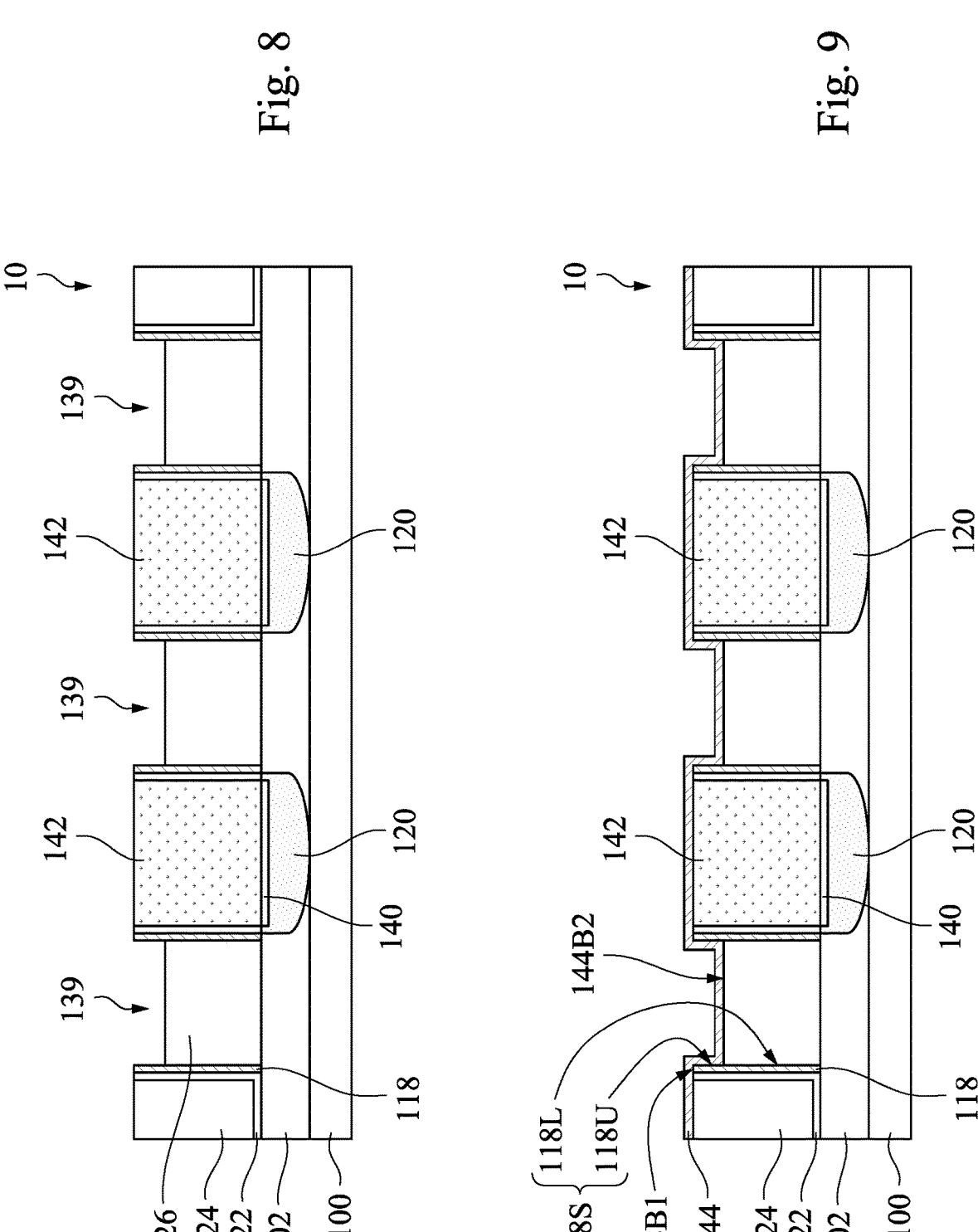

Reference is made to FIG. 8. One or more wet or dry etching processes are performed to remove the hard mask layer 138 to thereby define a plurality of gate spaces 139. In FIG. 8 the hard mask layers 138 are fully removed to expose the replacement gate structures 126. The gate spaces 139 are defined by the exposed inner surfaces of the gate spacers 118 and the recessed top surfaces of the replacement gate structures 126, respectively. For example, the hard mask layers 138 are removed by a wet etch selective to the hard mask layers 138. For example, the hard mask layers 138 may include silicon nitride and the wet etch may employ a hot phosphoric acid that selectively removes silicon nitride selective relative to silicon, silicon oxide, and metal.

Reference is made to FIG. 9. An etch stop layer (ESL) 144 is formed over the structure of FIG. 8. The ESL 144 can be conformally deposited in the gate space 139 where the hard mask layer 138 were removed (e.g., on the replacement gate structures 126 and sidewalls of the gate spacers 118) and on the top surfaces of the first ILD layer 124, the CESL 122, and the gate spacers 118. The etch stop layer 144 may include silicon nitride, a silicon-carbon based material, a carbon-doped oxide, and/or combinations thereof by using ALD, PEALD, CVD, PECVD, High-Density Plasma CVD (HDPCVD), or the like. The etch stop layer 144 may be different in composition than a subsequently formed second ILD layer and may have a different etch selectivity to prevent over-etching when patterning the second ILD layer 146. The etch stop layer 144 lines the gate spaces 139.

Each of the gate spacers 118 has an inner sidewall 118S having a lower region 118L interfacing the replacement gate structure 126 and an upper region 118U interfacing the etch stop layer 144. In some embodiments, the etch stop layer 144 has a bottom surface higher over the gate spacers 118 than over the replacement gate structure 126. For example, the etch stop layer 144 has a bottom surface 144B1 over the gate spacers 118 at a height higher than a bottom surface 144B2 over the replacement gate structure 126.

Figure 10:
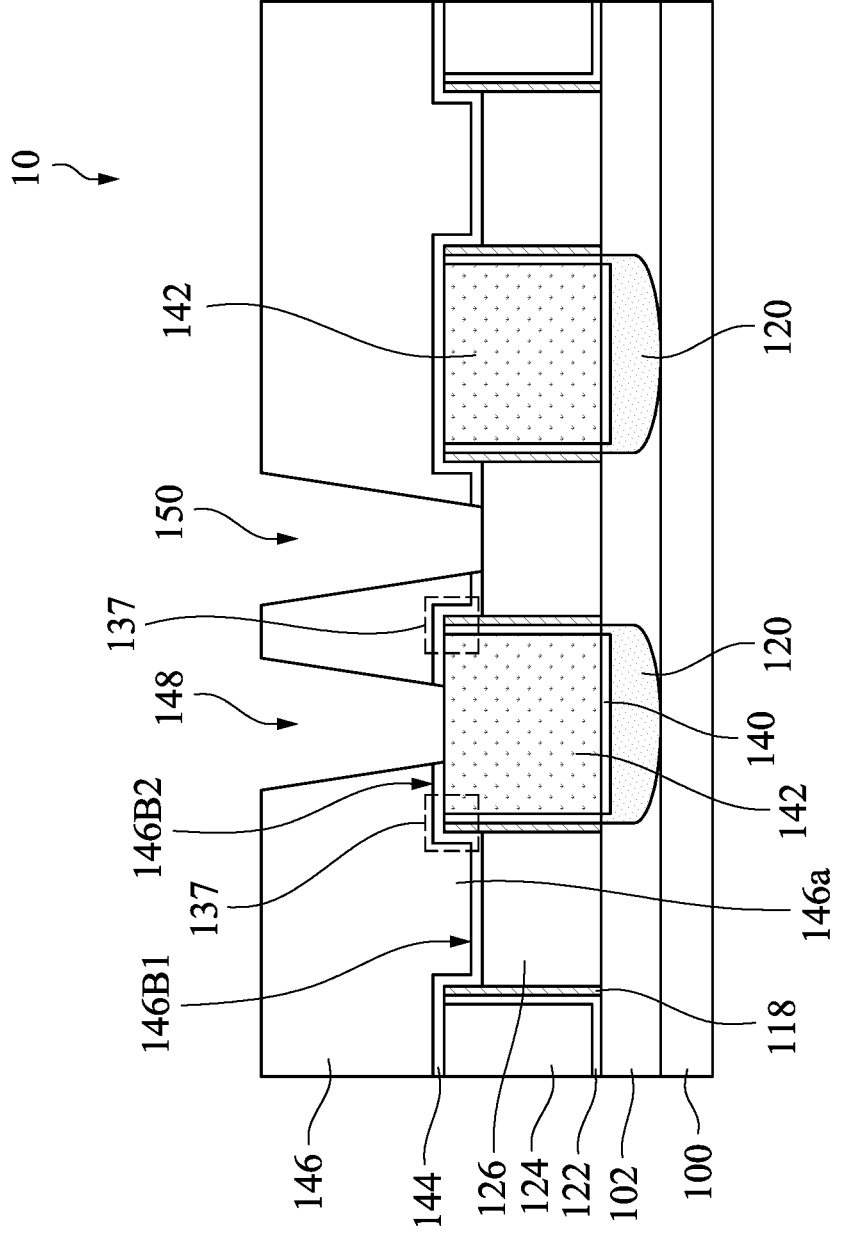

Referring to FIG. 10, a second ILD layer 146 is formed over the structure of FIG. 9. The second ILD layer 146 can fill remaining spaces where the hard mask layer 138 were removed. The second ILD layer 146 may be of similar materials and formed using similar processes as the first ILD layer 124, although any suitable material and method of manufacture may be utilized. The second ILD layer 146 has a protrusion 146a protruding toward the semiconductor substrate 100. That is, the second ILD layer 146 has a portion (e.g., the protrusion 146a) extending between the gate spacers 118. A bottom surface of the second ILD layer 146 is lower on the replacement gate structure 126 than on the source/drain contacts 142. For example, a bottom surface 146B1 of the second ILD layer 146 is lower than a bottom surface 146B2 of the second ILD layer 146.

Then, a patterning operation is performed to form via holes 148 and 150 through the second ILD layer 146 and the etch stop layer 144. The via holes 148 and 150 penetrates the second ILD layer 146 and the ESL 144. The via hole 148 is over the source/drain contact 142 such that the source/drain contact 142 is exposed by the via hole 148. The via hole 150 is over the replacement gate structure 126 such that the replacement gate structure 126 is exposed by the via hole 150. Since the replacement gate structure 126 is free from an overlying self-align contact (SAC), challenge for etching the via hole 150 through the SAC can be prevented.

Figure 11:
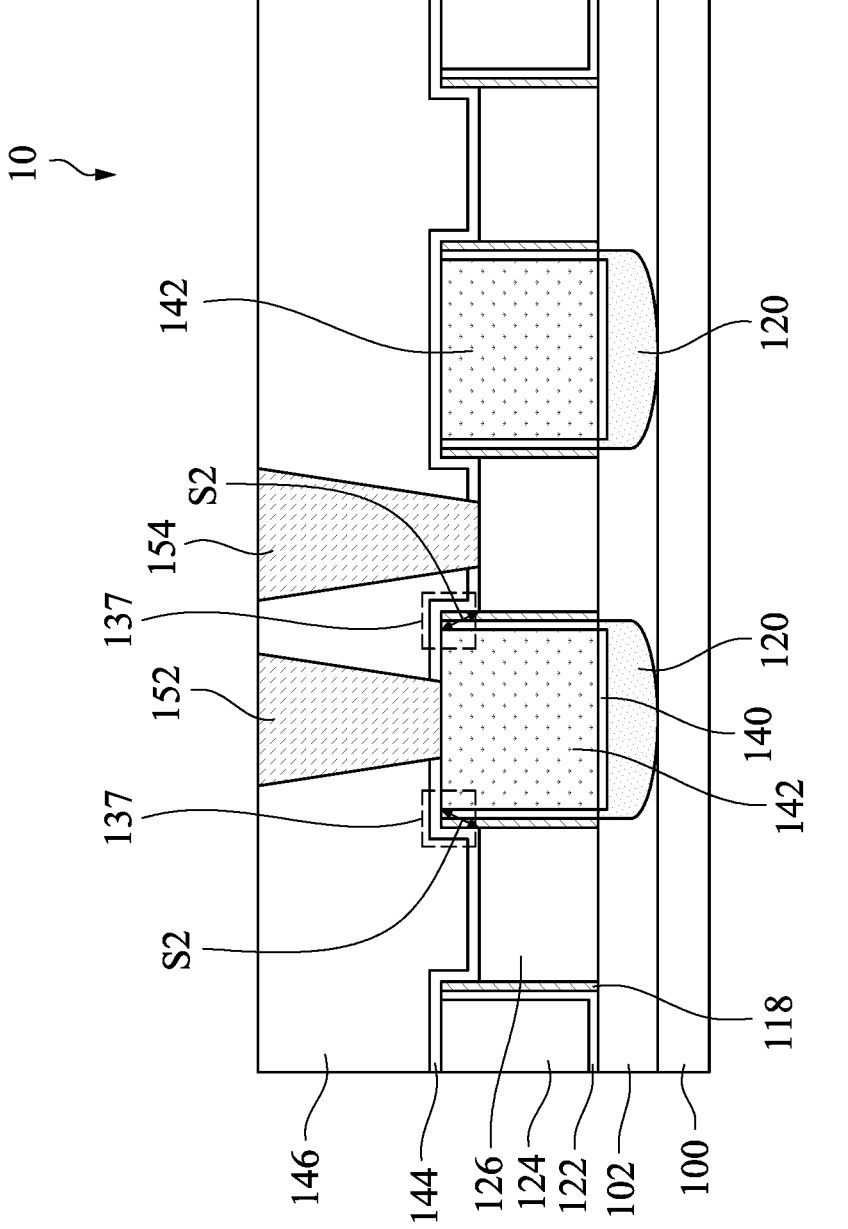

Afterwards, a conductive material is deposited to fill the via holes 148 and 150 and over the second ILD layer 146, in which a single layer or a multilayer (including a plurality of conductive layers) is formed. Next, a planarization step such as CMP is performed to remove excess material of the conductive material on the second ILD layer 146, to planarize the top surface of the IC structure 10. The remaining portion of the conductive material refers to via plugs 152 and 154. The resulting structure is shown in FIG. 11.

The via holes are filled with one or more conductive materials so as to form via plugs 152, 154 over the source/drain contact 142 and the replacement gate structure 126, respectively. The via plugs 152, 154 may provide interconnection to one or more of the interconnect layers of a multilayer interconnect (MLI). The via plugs 152, 154 may include tungsten or other suitable conductive element. The via plug 152 can be referred to as source/drain via because it is formed over the source/drain contact 142, and the via plug 154 can be referred to as a gate via because it is formed over the replacement gate structure 126.

Due to the wing parts 137 of the gate spacer 118 and the CESL 122, an increased distance S2 between the source/drain contacts 142 and the adjacent replacement gate structure 126 are provided. That way, even if process variations lead to shifts in placements of the IC features, the replacement gate structure 126 and the source/drain contacts 142 are unlikely to be in physical contact, thereby preventing electrical shorting or leakage. It is understood that the IC structure 10 shown in FIG. 11 undergoes further complementary metal-oxide-semiconductor (CMOS) processes to form various features such as interconnect metal layers, dielectric layers, passivation layers, etc.

Figures 12, 13:
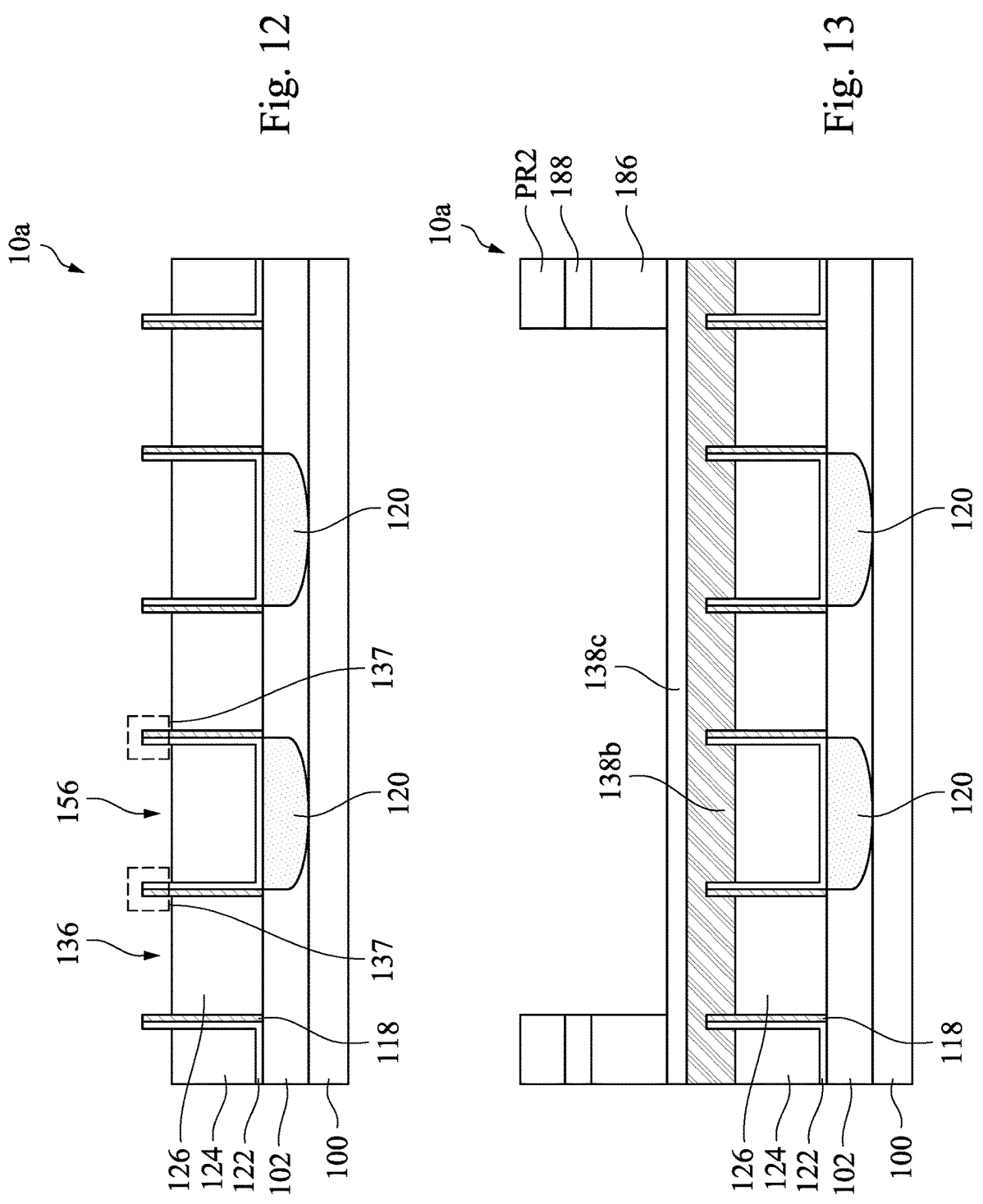
FIGS. 12-22 show cross-sectional views of intermediate stages in fabricating an IC structure according to some embodiments of the present disclosure.

FIGS. 12-23 show cross-sectional views of intermediate stages in fabricating an IC structure 10a according to some embodiments of the present disclosure. Many aspects of the IC structure 10a are similar to those of the IC structure 10. One difference between the two IC structures lies in the first ILD layer 124 of the IC structure 10a are recessed in an etching step, so that recesses 156 are formed, as shown in FIG. 12. The recesses 156 are defined by the exposed inner surfaces of the CESL 122 and the recessed top surfaces of the first ILD layer 124, respectively. Top portions of the gate spacers 118 and the CESL 122 can be collectively referred to as a wing part 137.

Figures 14, 15:
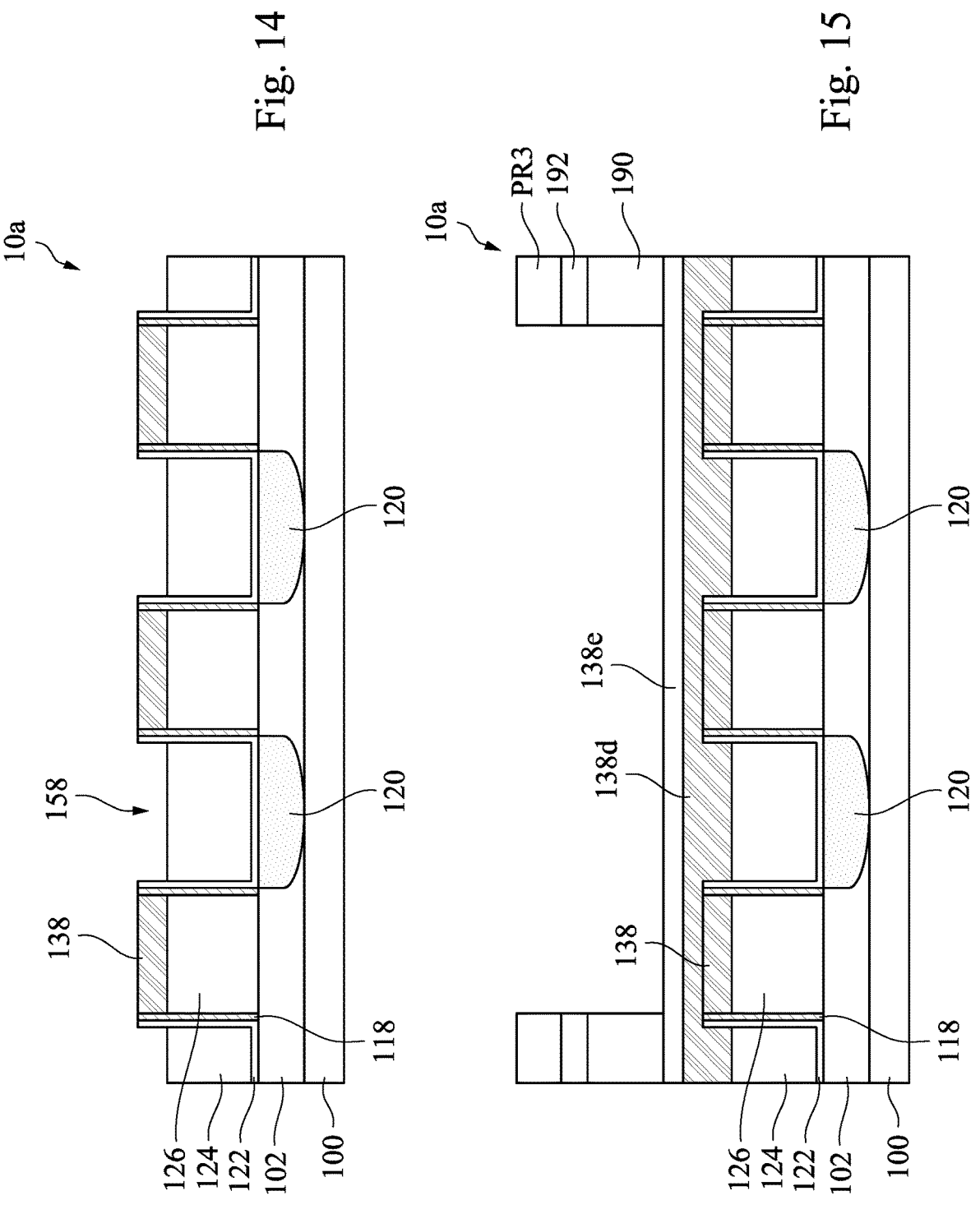

In FIG. 13, a hard mask material 138b is formed over the structure in FIG. 12. For example, the hard mask material 138b fills the recesses 136 over the replacement gate structure 126 and the recesses 156 over the first ILD layer 124. Next, a planarization step such as CMP is performed to remove excess material of the hard mask material 138b, to planarize the top surface of the IC structure 10a. Then, a MD hard mask 138c is formed on the hard mask material 138b. A tri-layer mask including a bottom layer 186, a middle layer 188 and a photoresist PR2 may be spin coated on the MD hard mask 138c. The tri-layer mask is then patterned, and the MD hard mask 138c may be patterned by the tri-layer mask to form openings exposing the hard mask material 138b over the source/drain epitaxial structures 120. The exposed hard mask material 138b is then removed by an etching process. After etching, the patterned tri-layer mask (i.e., the bottom layer 186, the middle layer 188 and the photoresist PR2) and the MD hard mask 138c are removed, such as by an acceptable ashing or stripping process. The hard mask layer 138 remains over the replacement gate structure 126 and between the gate spacers 118. The resulting structure is shown in FIG. 14. The first ILD layer 124 is exposed by recesses 158.

Reference is made to FIG. 15. A hard mask material 138d is formed over the structure in FIG. 14. A MD hard mask 138e is formed over the hard mask material 138d. A tri-layer mask including a bottom layer 190, a middle layer 192 and a photoresist PR3 may be spin coated on the MD hard mask 138e. The tri-layer mask is then patterned, and the MD hard mask 138e will then by patterned by the tri-layer mask to form openings exposing the first ILD layer 124 over the source/drain epitaxial structures 120. The exposed first ILD layer 124 is then removed by an etching process. After etching, the tri-layer mask (i.e., the bottom layer 190, the middle layer 192 and the photoresist PR3), the MD hard mask 138e and the hard mask material 138d are removed, such as by an acceptable ashing or stripping process.

Figure 16:
Figure 16:
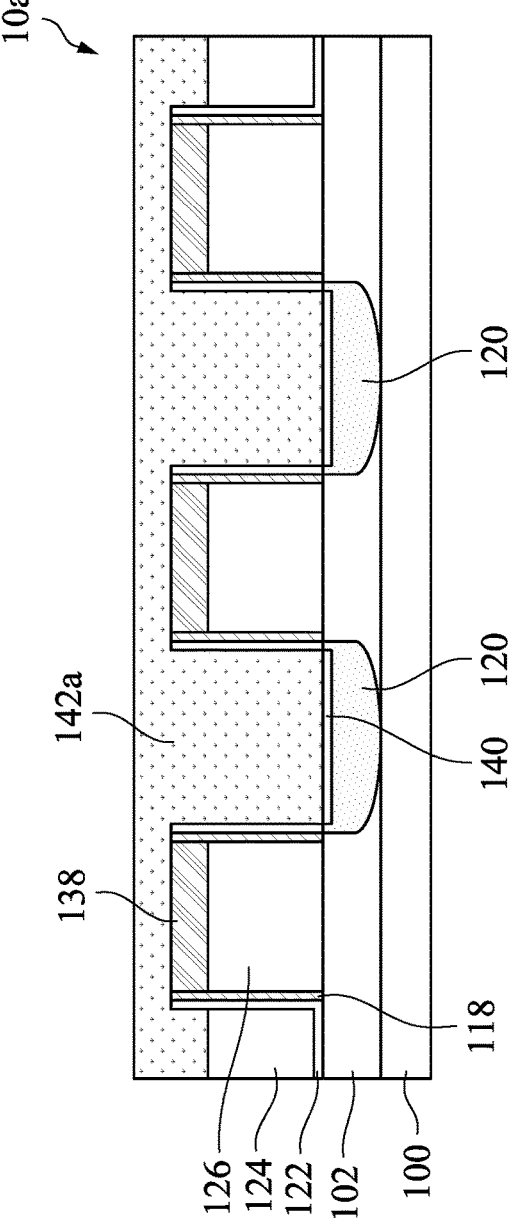
Figure 17:
Figure 17:
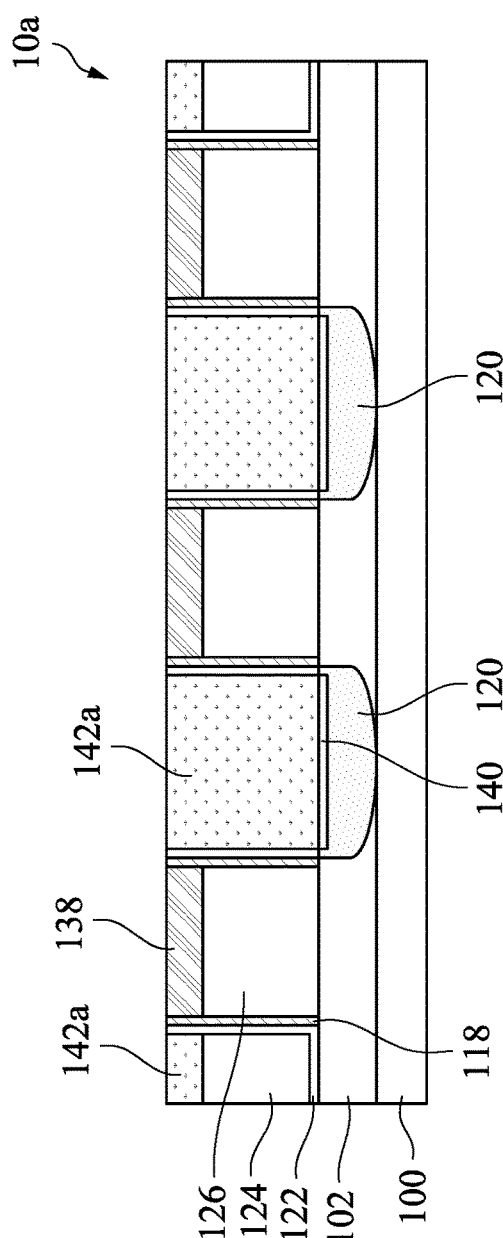

Silicide regions 140 are formed by a process that includes depositing a metal layer, such as titanium, cobalt, nickel, tungsten, or the like, over the device, including the exposed surfaces of the source/drain epitaxial structures 120 and then annealing the metal layer such that the metal layer is able to react with the source/drain epitaxial structures 120 to form silicide regions 140, and removing the non-reacted metal layer. Afterwards, a conductive material 142a is deposited, in which a single layer or a multilayer (including a plurality of conductive layers) is formed. The resulting structure is shown in FIG. 16. Next, a planarization step such as CMP is performed to remove excess material of the conductive material 142a to planarize the top surface of the IC structure 10a, as shown in FIG. 17. Portions of the conductive material 142a remain over the first ILD layer 124 and the source/drain epitaxial structures 120.

Figures 18, 19:
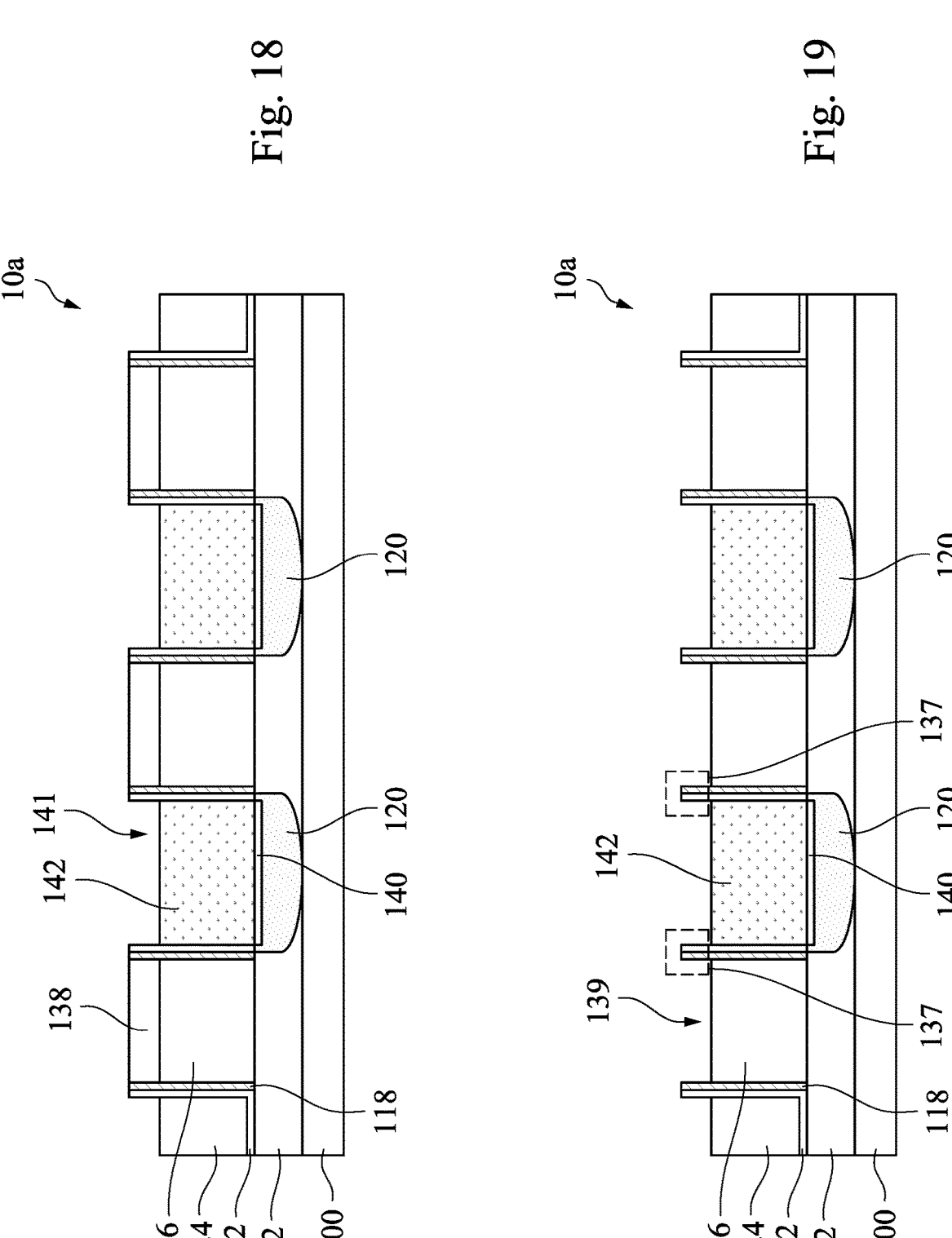

The conductive material 142a has different etch selectivity than the hard mask layer 138, the gate spacers 118, the CESL 122, and the first ILD layer 124 so as to selective etch back the conductive material 142a. The remaining portion of the conductive material 142a over the source/drain epitaxial structure 120 can be referred to as source/drain contacts 142, as shown in FIG. 18. The conductive material 142a over the first ILD layer 124 is removed to expose the first ILD layer 124. A recess 141 is formed between sidewalls of the CESL 122.

Reference is made to FIG. 19. One or more wet or dry etching processes are performed to remove the hard mask layer 138 to thereby define a plurality of gate spaces 139. The hard mask layers 138 are fully removed to expose the replacement gate structures 126. The gate spaces 139 are defined by the exposed inner surfaces of the gate spacers 118 and the recessed top surfaces of the replacement gate structures 126, respectively. For example, the hard mask layers 138 are removed by a wet etch selective to the hard mask layers 138. For example, the hard mask layers 138 may include silicon nitride and the wet etch may employ a hot phosphoric acid that selectively removes silicon nitride selective relative to silicon, silicon oxide, and metal.

Figure 20:
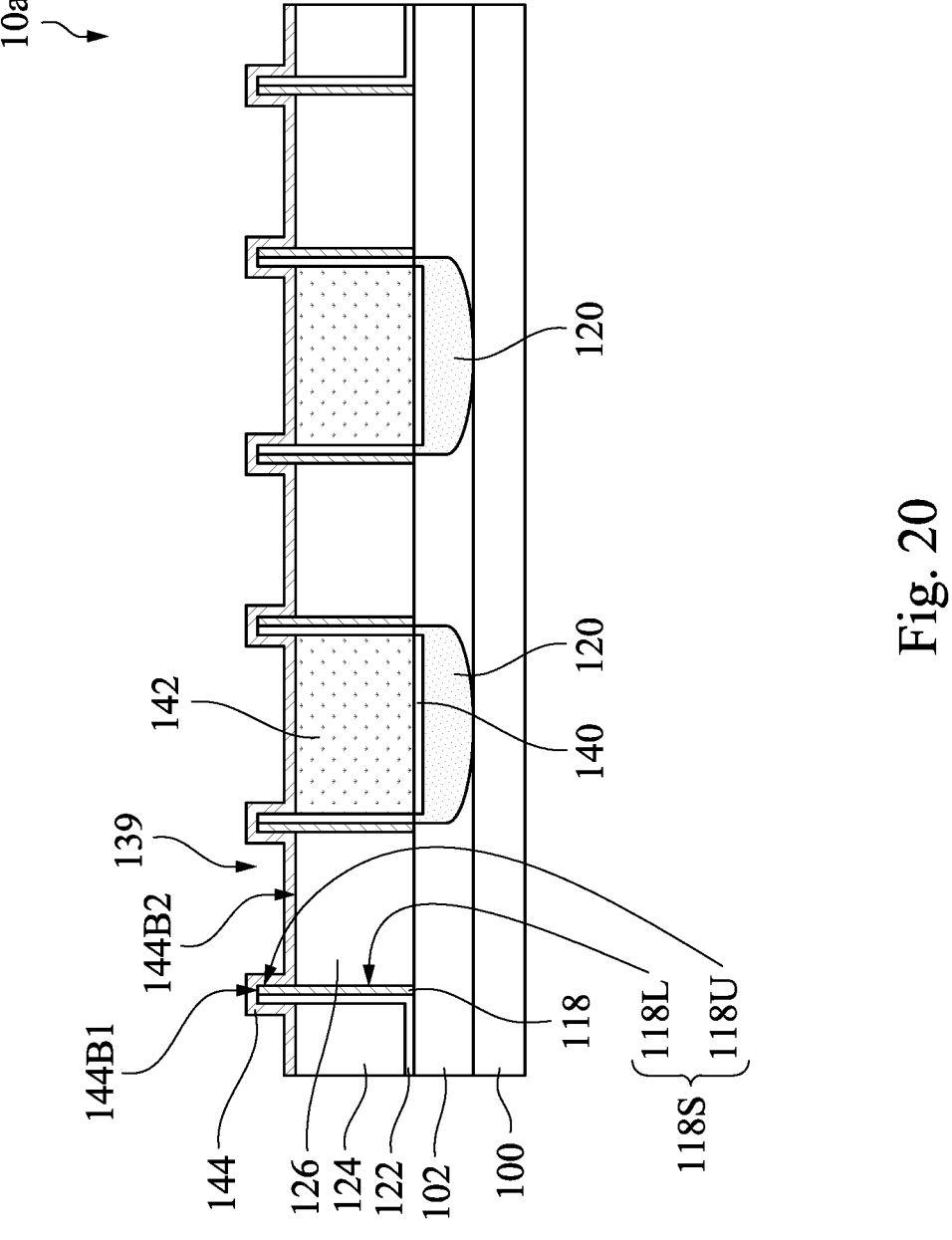

Reference is made to FIG. 20. The ESL 144 is formed over the structure of FIG. 19. The etch stop layer 144 may include silicon nitride, a silicon-carbon based material, a carbon-doped oxide, and/or combinations thereof by using atomic layer deposition (ALD), plasma enhanced ALD (PEALD), CVD, plasma enhanced CVD (PECVD), High-Density Plasma CVD (HDPCVD), or the like. The etch stop layer 144 may be different in composition than a subsequently formed second ILD layer and may have a different etch selectivity to prevent over-etching when patterning the second ILD layer 146. The etch stop layer 144 lines the gate spaces 139. Each of the gate spacers 118 has an inner sidewall 118S having a lower region 118L interfacing the replacement gate structure 126 and an upper region 118U interfacing the etch stop layer 144. In some embodiments, the etch stop layer 144 has a bottom surface higher over the gate spacers 118 than over the replacement gate structure 126. For example, the etch stop layer 144 has a bottom surface 144B1 over the gate spacers 118 at a height higher than a bottom surface 144B2 over the replacement gate structure 126.

Figure 21:
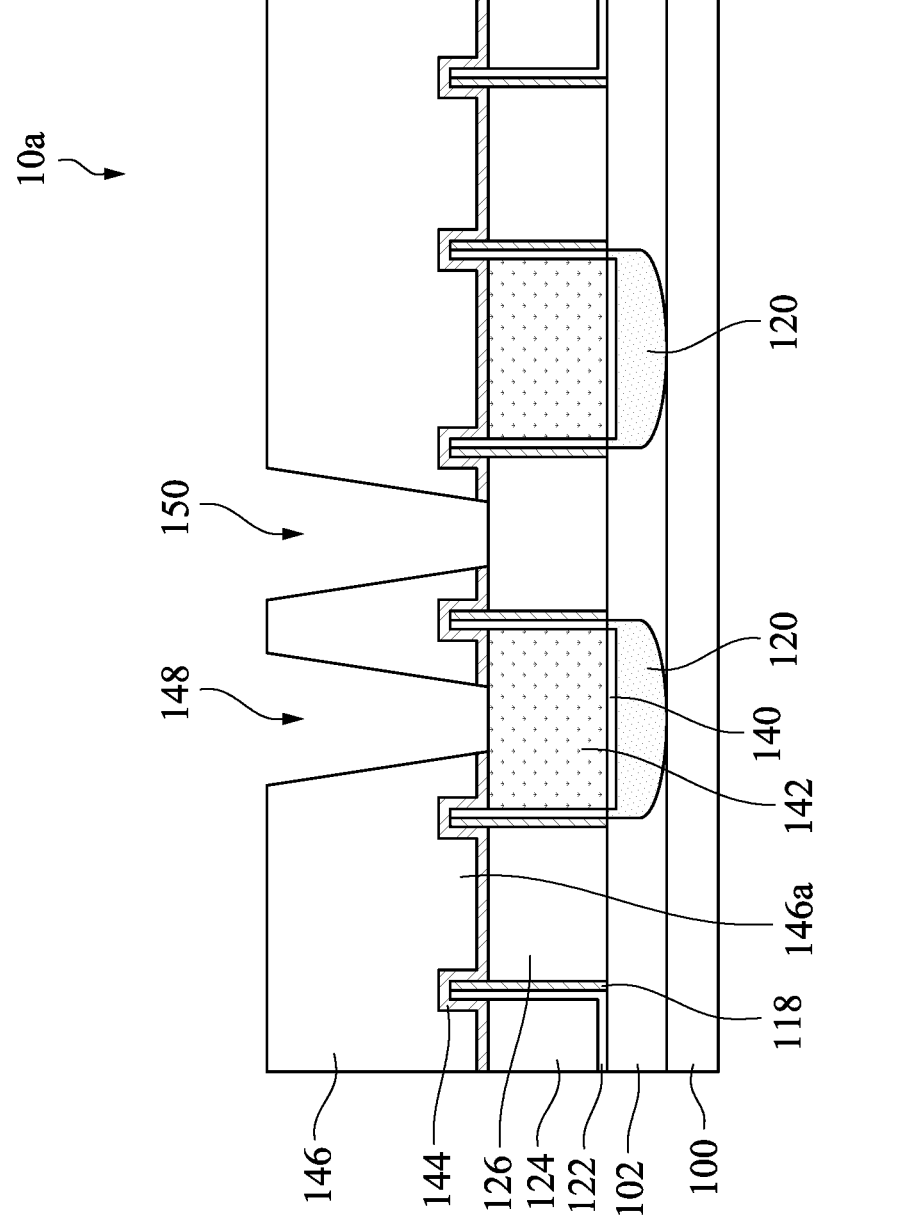

Referring to FIG. 21, a second ILD layer 146 is formed over the structure of FIG. 20. The second ILD layer 146 can fill remaining spaces where the hard mask layer 138 were removed. The second ILD layer 146 may be of similar materials and formed using similar processes as the first ILD layer 124, although any suitable material and method of manufacture may be utilized. The second ILD layer 146 has a protrusion 146a protruding toward the semiconductor substrate 100. That is, the second ILD layer 146 has a portion (e.g., the protrusion 146a) extending between the gate spacers 118.

Then, a patterning operation is performed to form via holes 148 and 150 through the second ILD layer 146 and the etch stop layer 144. The via holes 145 and 150 penetrates the second ILD layer 146 and the ESL 144. The via hole 148 is over the source/drain contact 142 such that the source/drain contact 142 is exposed by the via hole 148. The via hole 150 is over the replacement gate structure 126 such that the replacement gate structure 126 is exposed by the via hole 150. Since the replacement gate structure 126 is free from an overlying self-align contact (SAC), challenge for etching the via hole 150 through the SAC can be prevented.

Figure 22:
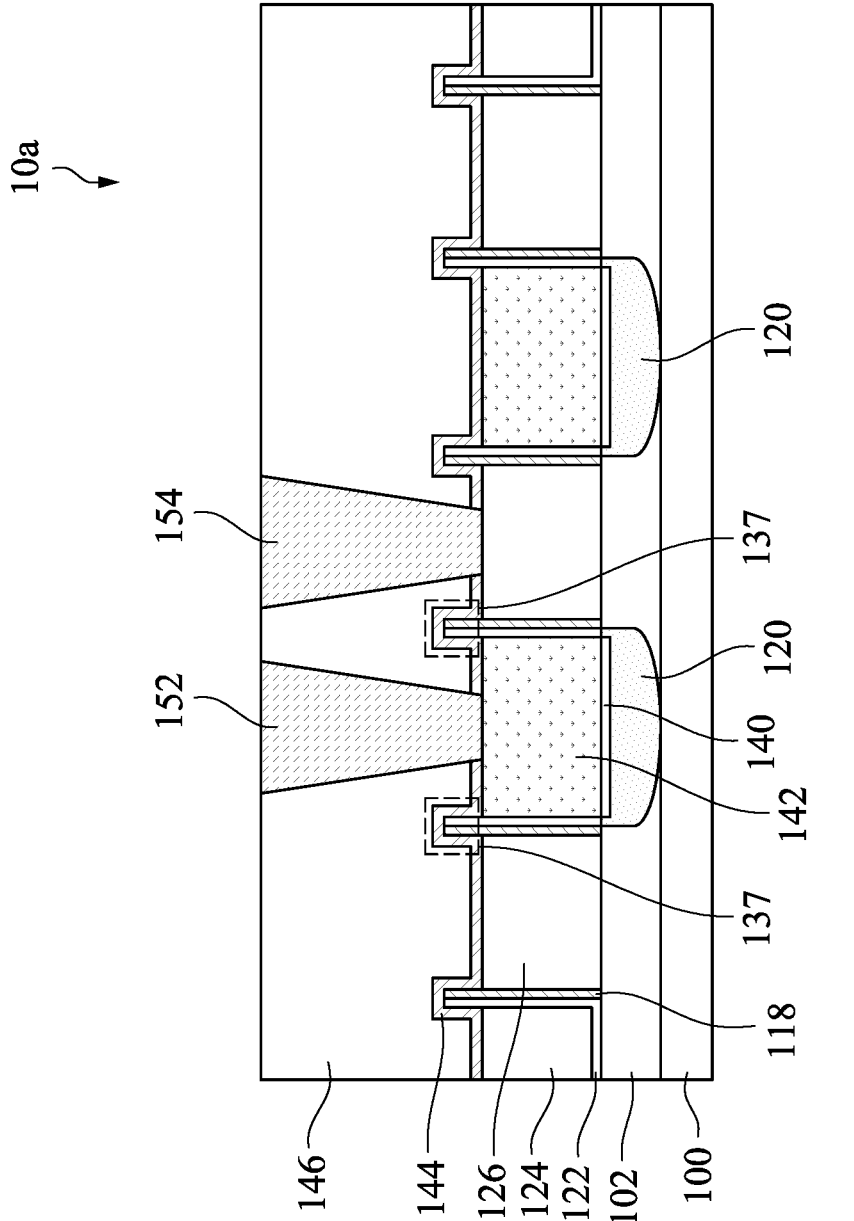

Afterwards, a conductive material is deposited to fill the via holes 148 and 150 and over the second ILD layer 146, in which a single layer or a multilayer (including a plurality of conductive layers) is formed. Next, a planarization step such as CMP is performed to remove excess material of the conductive material on the second ILD layer 146, to planarize the top surface of the IC structure 10a. The remaining portion of the conductive material refers to via plugs 152 and 154. The resulting structure is shown in FIG. 22.

The via holes are filled with one or more conductive materials so as to form via plugs 152, 154 over the source/drain contact 142 and the replacement gate structure 126, respectively. The via plugs 152, 154 may provide interconnection to one or more of the interconnect layers of a multilayer interconnect (MLI). The via plugs 152, 154 may include tungsten or other suitable conductive element. The via plug 152 can be referred to as source/drain via because it is formed over the source/drain contact 142, and the via plug 154 can be referred to as a gate via because it is formed over the replacement gate structure 126.

Due to the wing parts 137 of the gate spacer 118 and the CESL 122, That way, even if process variations lead to shifts in placements of the IC features, the replacement gate structure 126 and the source/drain contacts 142 are unlikely to be in physical contact, thereby preventing electrical shorting or leakage. It is understood that the IC structure 10a shown in FIG. 22 undergoes further CMOS processes to form various features such as interconnect metal layers, dielectric layers, passivation layers, etc.

Figure 23:
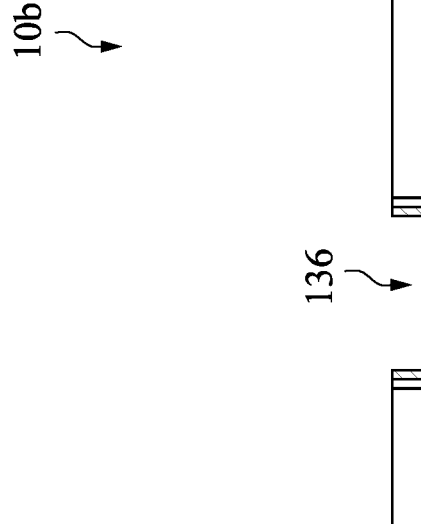
FIGS. 23, 24, 25, 26, 27, 28, 29, 30A, 30B and 30C show cross-sectional views of intermediate stages in fabricating an IC structure according to some embodiments of the present disclosure.
Figure 24:
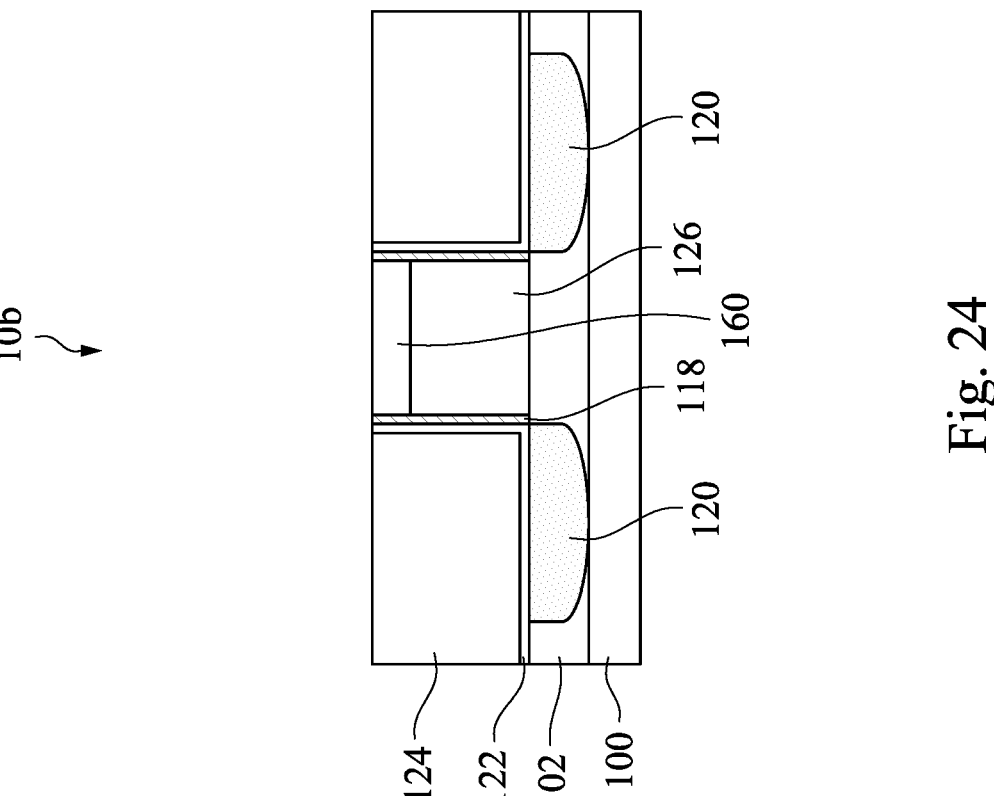

FIGS. 23-30 show cross-sectional views of intermediate stages in fabricating an IC structure 10b according to some embodiments of the present disclosure. The IC structure 10b at this fabrication stage of FIG. 23 can be prepared by the operation as illustrated in FIGS. 1-5. As shown in FIG. 23, the replacement gate structure 126 is recessed in an etching step(s), so that the recess 136 is formed. In FIG. 24, a gate cap layer 160 is then formed in the recess 136 above the replacement gate structure 126. The gate cap layer 160 may be formed by depositing a layer of gate cap material to over-fill the recess 136 and, thereafter, performing a CMP process to remove excess portions of the gate cap material layer positioned above the surface of the first ILD layer 124. In some embodiments, the gate cap layer 160 includes $SiO_2$, SiCN, SiON, $Al_2O_3$, $La_2O_3$, SiN, a combination thereof, or the like, but other suitable dielectric films may be used. The gate cap layer 440 may be formed using, for example, atomic layer deposition (ALD), plasma enhanced atomic layer deposition (ALD), CVD, PVD, spin-on-glass, or the like. The gate cap layer 160 is formed so as to protect the replacement gate structure 126 during subsequent processes.

Silicide regions 140 are formed by a process that includes depositing a metal layer, such as titanium, cobalt, nickel, tungsten, or the like, over the device, including the exposed surfaces of the source/drain epitaxial structures 120 and then annealing the metal layer such that the metal layer is able to react with the source/drain epitaxial structures 120 to form silicide regions 140, and removing the non-reacted metal layer. Afterwards, a conductive material is deposited, in which a single layer or a multilayer (including a plurality of conductive layers) is formed. Next, a planarization step such as CMP is performed to remove excess material of the conductive material, to planarize the top surface of the device. The remaining portion of the conductive material refers to source/drain contacts 142. A resulting structure is shown in FIG. 25.

Figure 25:
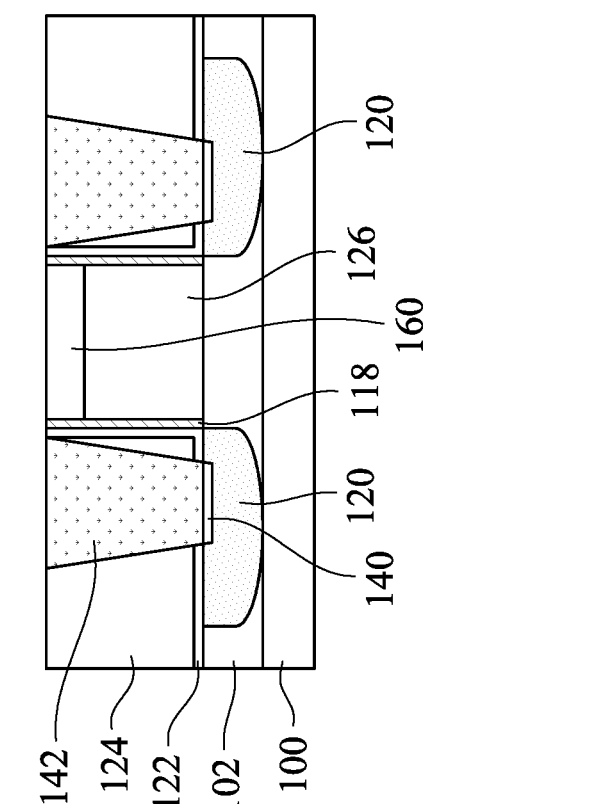
Figure 26:
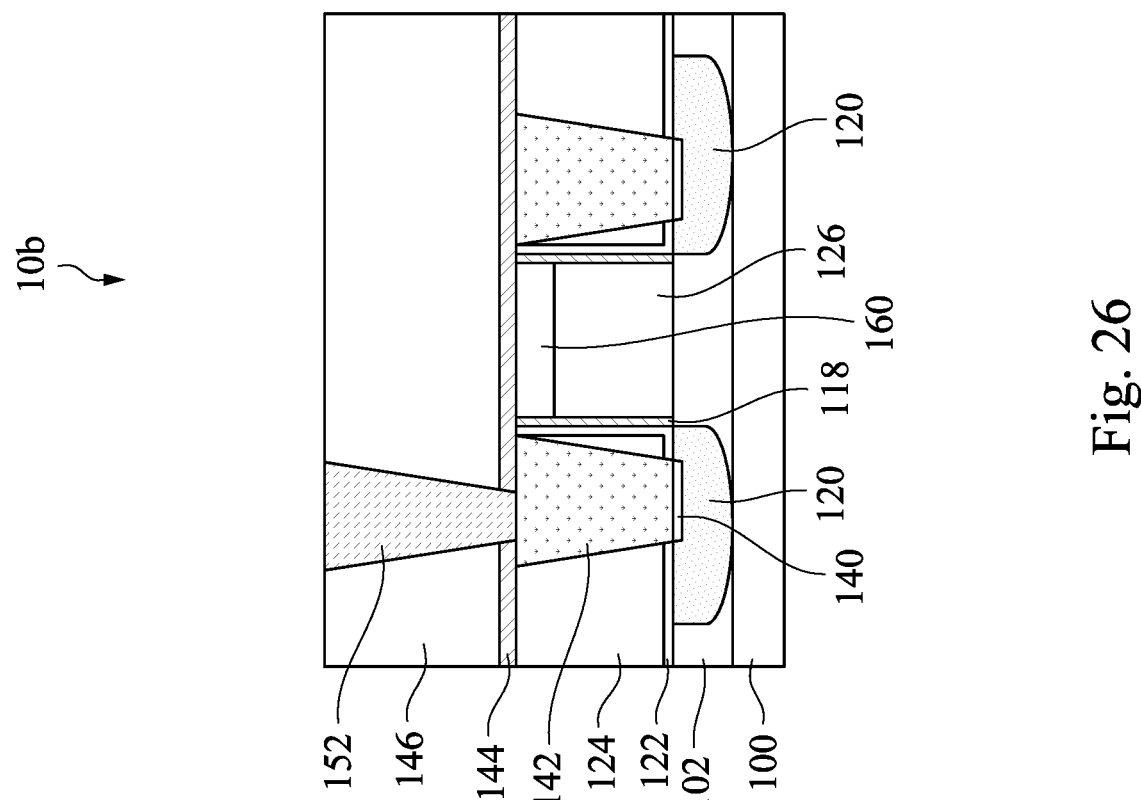

Referring to FIG. 26, an etch stop layer 144 and a second ILD layer 146 are formed over the structure of FIG. 25. The material and the formation method of the etch stop layer 144 is discussed previously with respect to FIG. 9. The description thereof is omitted herein. Then, a patterning operation is performed to form via holes through the second ILD layer 146 and the etch stop layer 144. A via hole is filled with one or more conductive materials so as to form a via plug 152 over the source/drain contact 142. The via plug 152 may provide interconnection to one or more of the interconnect layers of a multilayer interconnect (MLI). The via plug 152 may include tungsten or other suitable conductive element. The via plug 152 can be referred to as source/drain via because it is formed over the source/drain contact 142.

Figure 27:
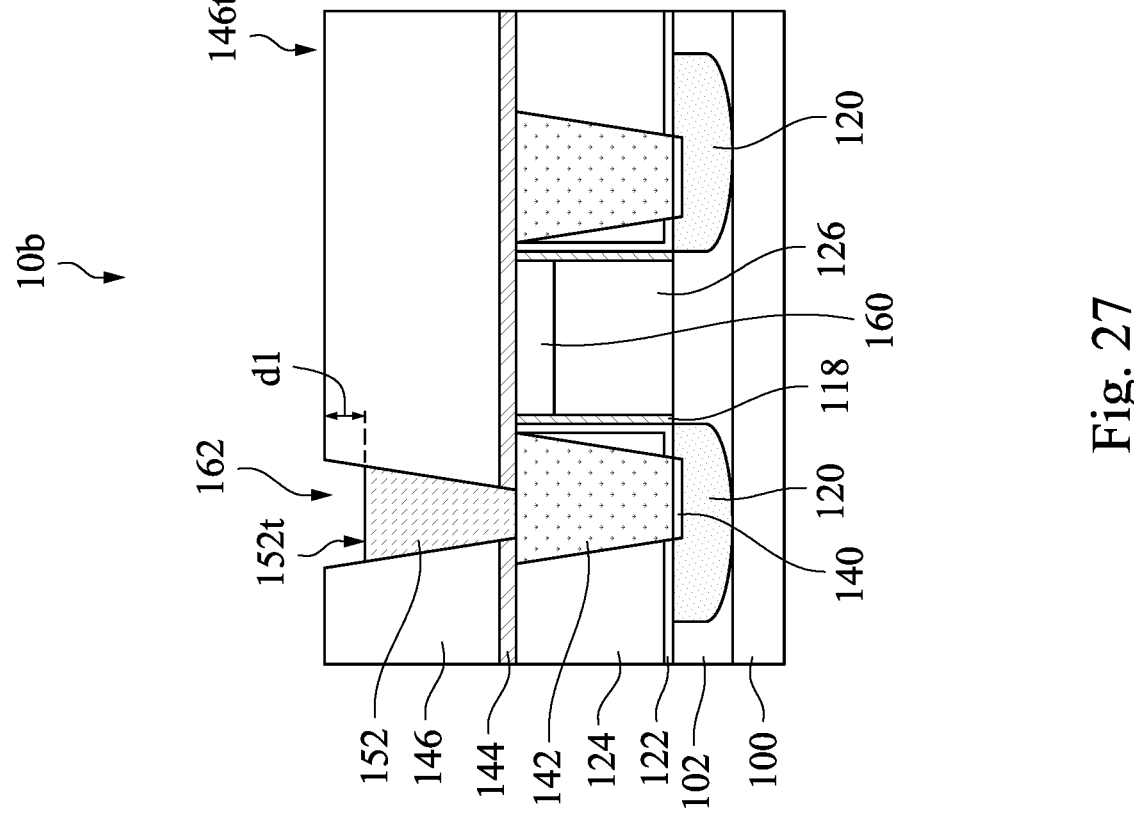

Reference is made to FIG. 27. The via plug 152 is etched back to form a recess 162. For example, an etch back process is performed such that the via plug 152 has a top surface 152*t* at a different height than a top surface 146*t* of the second ILD layer 146. The via plug 152 and the second ILD layer 146 are made of different materials. For example, the via plug 152 is made of material having a high etch selectivity with respect to the second ILD layer 146. Therefore, the via plug 152 can be selectively removed in a self-aligned manner. The etch back process can be performed by a dry etch process. The dry etch process can use a fluorine-based etchant. In some embodiments, the dry etch can be performed using a gas mixture including chlorine ($Cl_2$), carbon tetrafluoride ($CF_4$), fluoromethane ($CH_3F$), and fluoroform ($CHF_3$). Oxygen and hydrogen gases can be included in the gas mixture for etch selectivity. However, the disclosure is not limited thereto. The via plug 152 can be etched back by a vertical dimension d1 along a Z-axis from top surface of the second ILD layer 146. In some embodiments, the vertical dimension d1 is greater than 1 nm.

Figure 28:
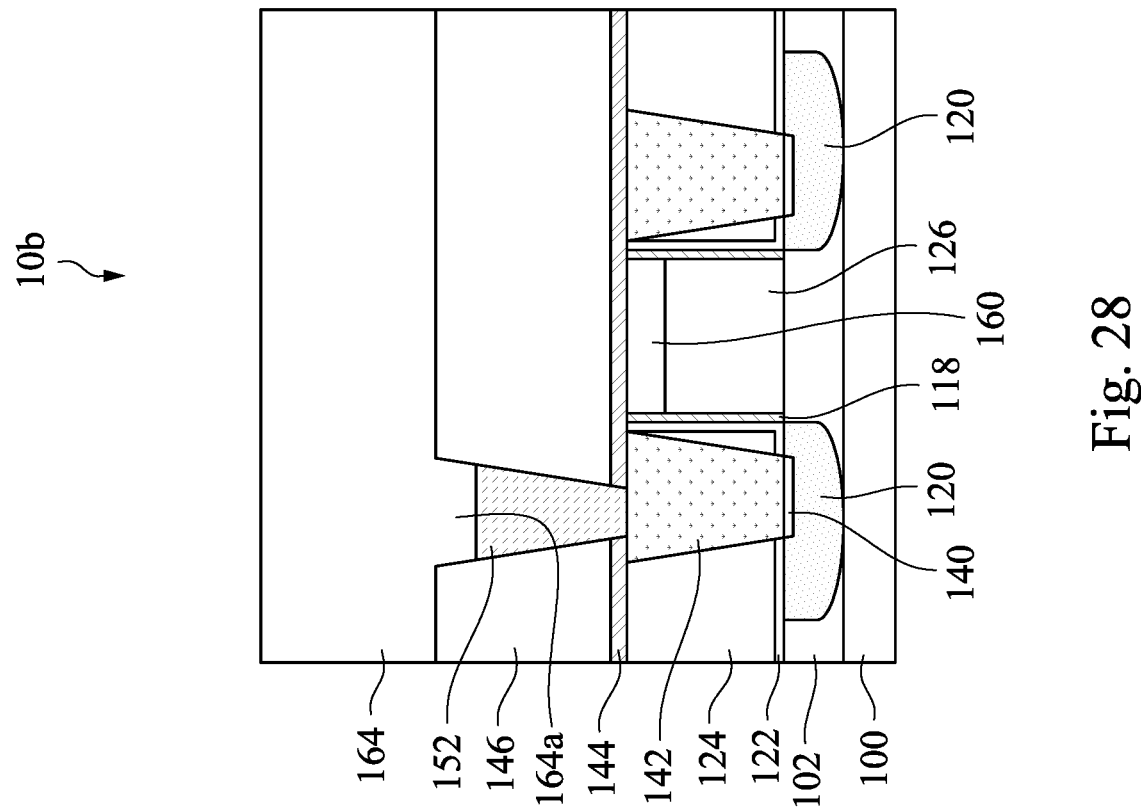

Reference is made to FIG. 28, After etching back the via plug 152, an etch stop layer (not shown) and a first inter metal dielectric (IMD) layer 164 is formed over the second ILD layer 146 and within the recess 162. The first IMD layer 164 may be of similar materials and formed using similar processes as the first ILD layer 124, although any suitable material and method of manufacture may be utilized. The first$^r$ IMD layer 164 has a protrusion 164*a* protruding toward the semiconductor substrate 100.

Figure 29:
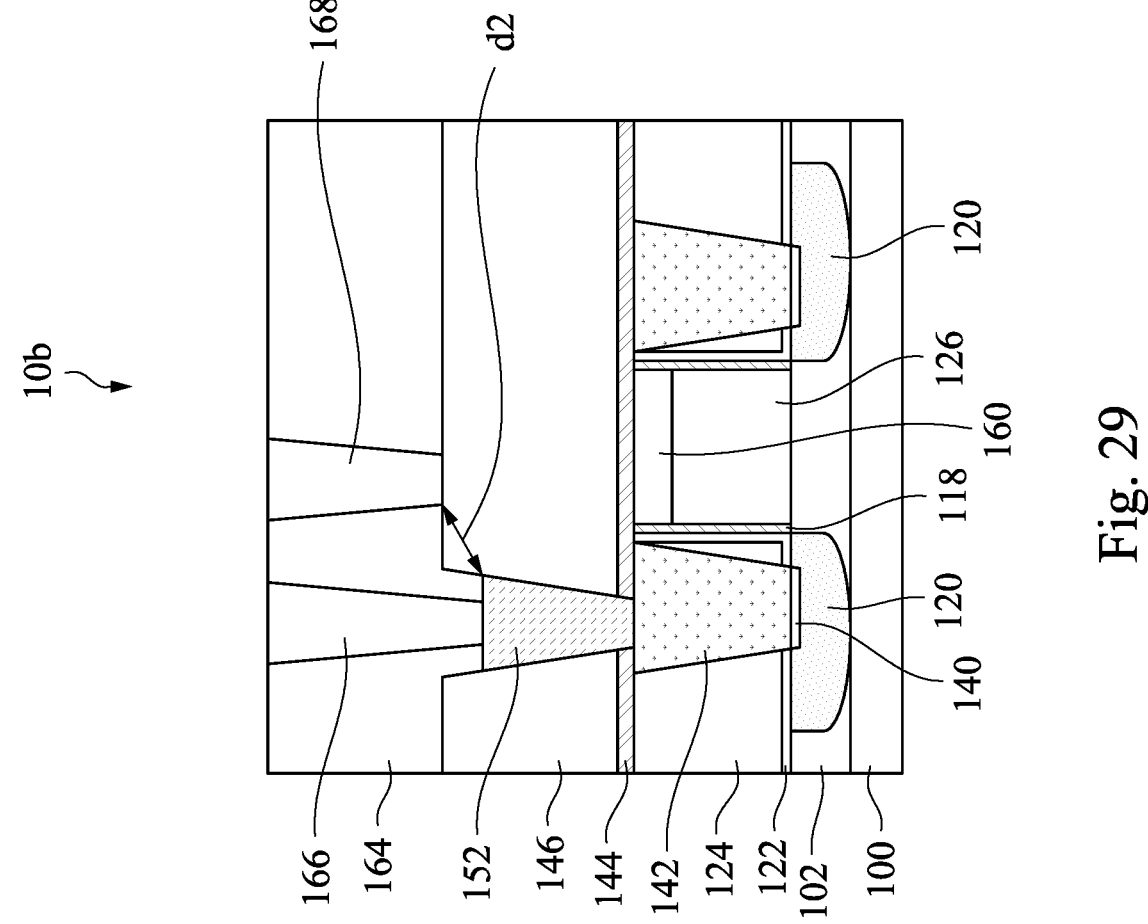

Then, a patterning operation is performed to form metal line through the first IMD layer 164. The via holes are filled with one or more conductive materials so as to form metal lines 166 and 168 over the via plug 152 and other features (not shown), as shown in FIG. 29. The metal lines 166 and 168 may provide interconnection to one or more of the interconnect layers of a multilayer interconnect. The metal lines 166 and 168 may include copper or other suitable conductive element. Due to an increased distance d2 between the metal line 168 and the via plug 152, an increased bridge window between the metal line 168 and the via plug 152 can be provided. That way, even if process variations lead to shifts in placements of the IC features, the via plug 152 and the metal line 168 are unlikely to be in physical contact, thereby preventing electrical shorting or leakage, improving yields.

Figure 30A:
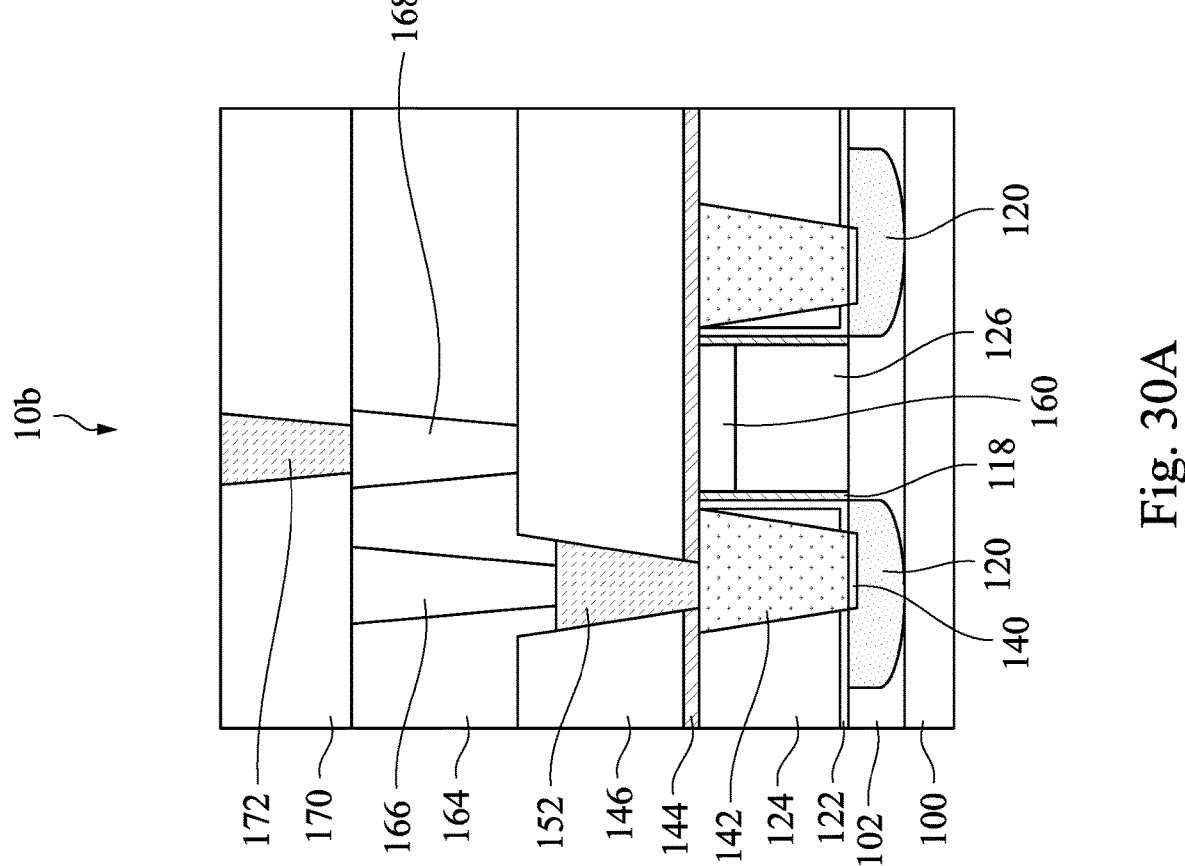
Figure 30B:
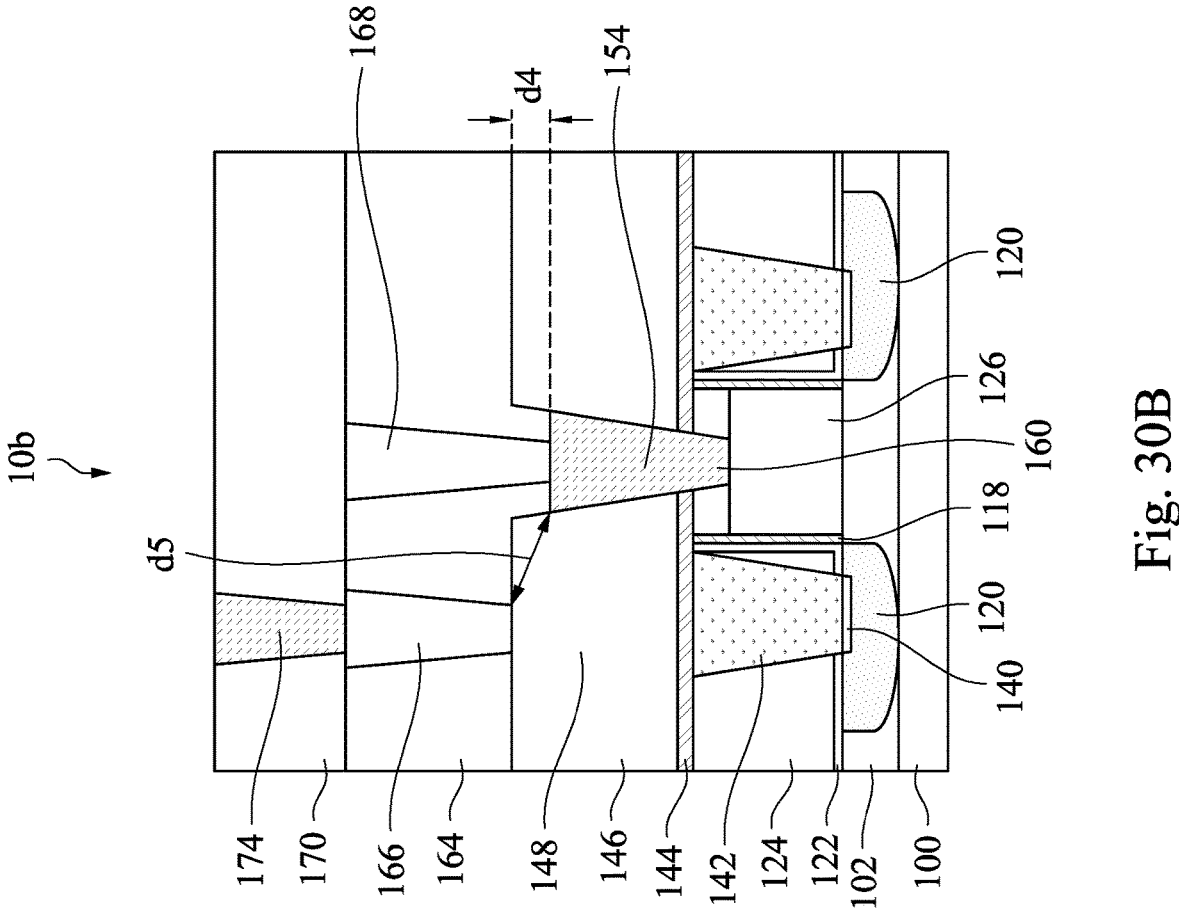

Reference is made to FIG. 30A. A second etch stop layer (not shown) and a second IMD layer 170 is formed on the first IMD layer 164. Then, a patterning operation is performed to form a via hole through the second IMD layer 170. The via hole is filled with one or more conductive materials so as to form via plug 172 over the metal line 168. The via plug 172 may provide interconnection to one or more of the interconnect layers of a multilayer interconnect. The via plug 172 may include copper or other suitable conductive element. The description herein is by separate via and metal trench process. In some other embodiments, via first or trench first dual damascene process may be applicable.

It is understood that the IC structure 10*b* shown in FIG. 30A undergoes further CMOS processes to form various features such as interconnect metal layers, dielectric layers, passivation layers, etc.

Although the IC structure 10*b* is shown as the source/drain via (i.e. the via plug 152) being etched back, any other suitable alternative via plug may alternatively be utilized. For example, in some embodiments, referring to FIG. 30B, the gate via (i.e., the via plug 154) is etched back by a vertical dimension d4 along a Z-axis from top surface of the second ILD layer 146. In some embodiments, the vertical dimension d4 is greater than 1 nm. Due to an increased distance d5 between the metal line 166 and the via plug 154, an increased bridge window between the metal line 166 and the via plug 154 can be provided. That way, even if process variations lead to shifts in placements of the IC features, the via plug 154 and the metal line 166 are unlikely to be in physical contact, thereby preventing electrical shorting or leakage, improving yields. However, the present disclosure is not limited thereto.

In the IC structure 10*b*, the interconnect structure includes a contact level, an OD (wherein the term "OD" represents "active region") level, via levels Via_0 level, Via_1 level, Via_2 level, and Via_x level, and metal-layer levels M1 level, M2 level, and Mx+1 level. Each of the levels includes one or more dielectric layers and the conductive features formed therein. In some embodiments, the conductive features that are at a via level may have top surfaces lower than the dielectric layer at the same via level.

Figure 30C:
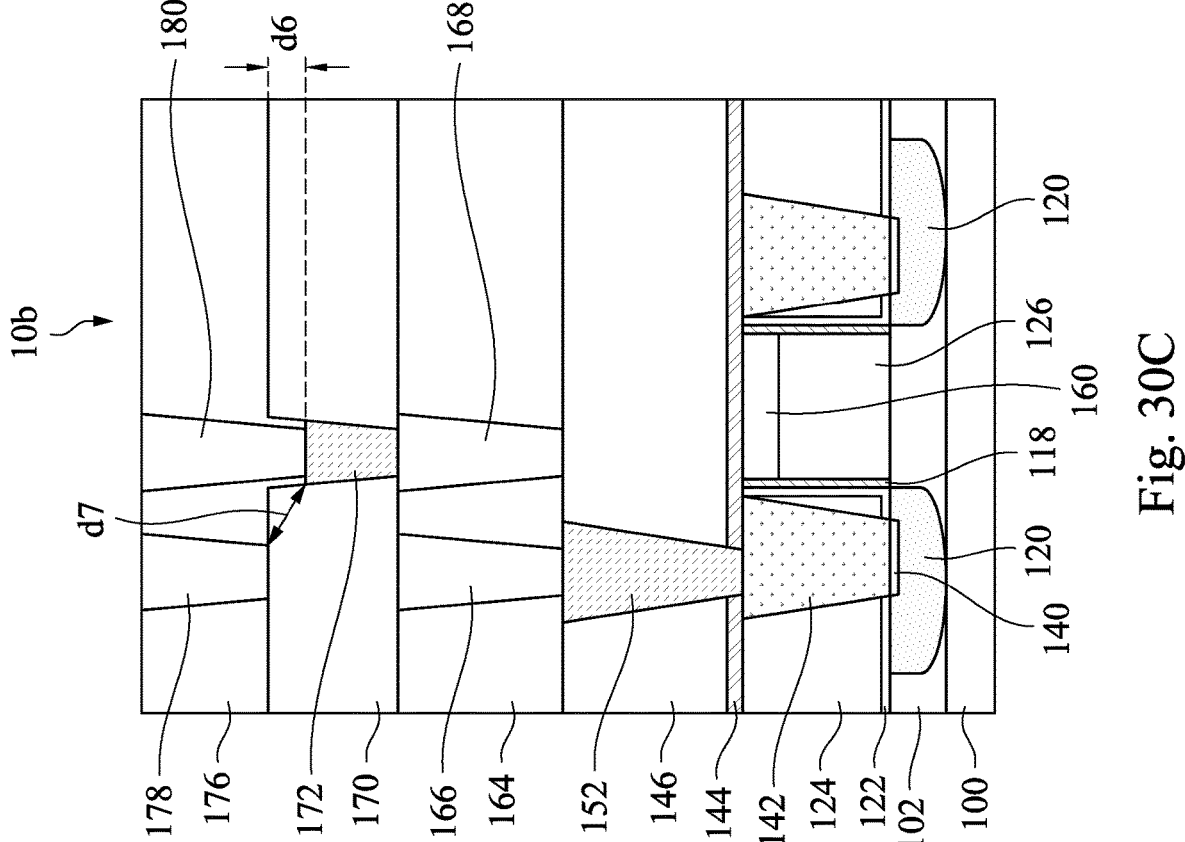

Reference is made to FIG. 30C. The via plug 172 is formed in a Via 0 (V0) layer. An etch stop layer (not shown) and a third IMD layer 176 can be formed on the second IMD layer 170 (or on the V0 layer). Metal lines 178 and 180 are formed in a metal-layer M1. Conductive feature (e.g., the via plug 172) that is at via level Via_0 level has a top surface lower than a top surface of the second IMD layer 170 that is in the via level Via_0. The description herein is by separate via and metal trench process. In some other embodiments, via first or trench first dual damascene process may be applicable.

The metal line 180 is directly over the via plug 172 and is electrically connected to the metal line 168 through the via plug 172. The via plug 172 is etched back by a vertical dimension d6 along a Z-axis from top surface of the second IMD layer 170. In some embodiments, the vertical dimension d6 is greater than 1 nm. Due to an increased distance d7 between the metal line 178 and the via plug 172, an increased bridge window between the metal line 178 and the via plug 172 can be provided. That way, even if process variations lead to shifts in placements of the IC features, the via plug 172 and the metal line 178 are unlikely to be in physical contact, thereby preventing electrical shorting or leakage, improving yields.

FIGS. 31-34 show cross-sectional views of intermediate stages in fabricating an IC structure 10*c* according to some embodiments of the present disclosure. The IC structure 10*c* at this fabrication stage of FIG. 31 can be prepared by the operation as illustrated in FIG. 26.

Figure 31:
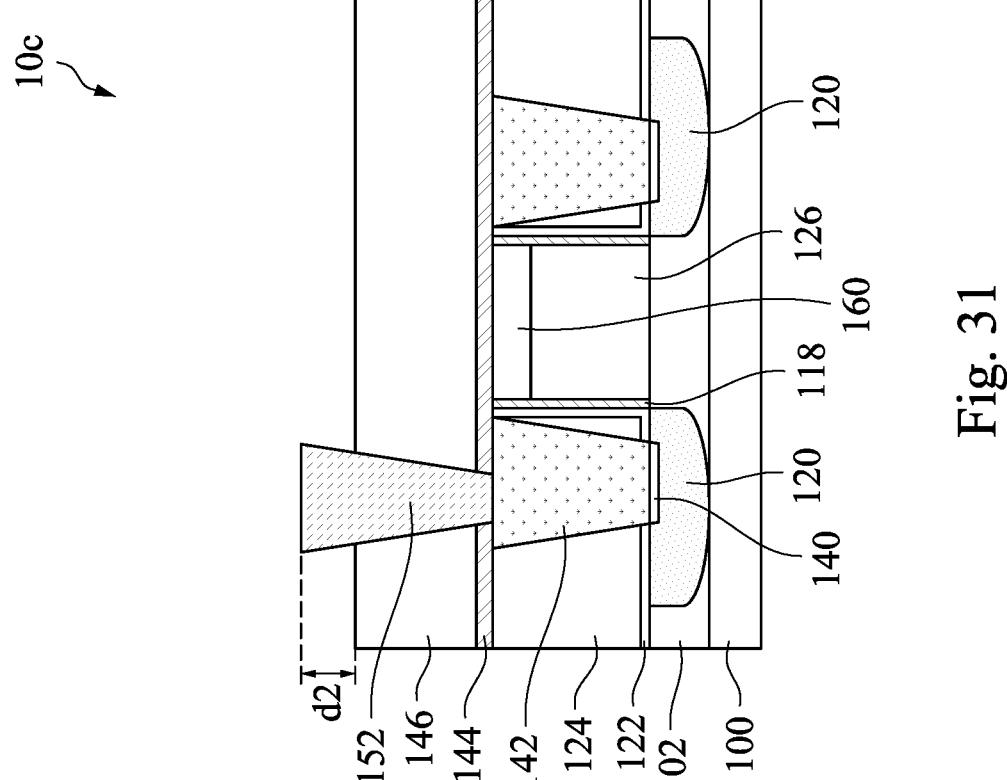
FIGS. 31-34 show cross-sectional views of intermediate stages in fabricating an IC structure according to some embodiments of the present disclosure.

Reference is made to FIG. 31. The second ILD layer 146 is etched back such that the second ILD layer 146 has a top surface lower than a top surface of the via plug 152. The via plug 152 and the second ILD layer 146 are made of different materials. For example, the via plug 152 is made of material having a high etch selectivity with respect to the second ILD layer 146. Therefore, the via plug 152 can be selectively removed in a self-aligned manner. The etch back of the second ILD layer 146 can be performed, for example, by a dry etch process, a wet etch process, or a combination thereof. In some embodiments, the dry etch process can include using a plasma dry etch with a gas mixture having octafluorocyclobutane ($C_4F_8$), $C_4F_6$, argon (Ar), oxygen $(O_2)$, and helium (He), fluoroform $(CHF_3)$ and He, carbon tetrafluoride $(CF_4)$, difluoromethane $(CH_2F_2)$, chlorine $(Cl_2)$, and $O_2$, hydrogen bromide (HBr), $O_2$, and He, or a combination thereof. In some embodiments, the wet etch process can include using a diluted hydrofluoric acid (DHF) treatment and vapor hydrofluoric acid (VHF) as etchants and inert gases, such as Ar, xenon (Xe), He, or a combination thereof. However, the disclosure is not limited thereto. The second ILD layer 146 can be etched back by a vertical dimension d2 along a Z-axis from top surface of via plug 152. In some embodiments, the vertical dimension d2 is greater than 1 nm.

Figure 32:
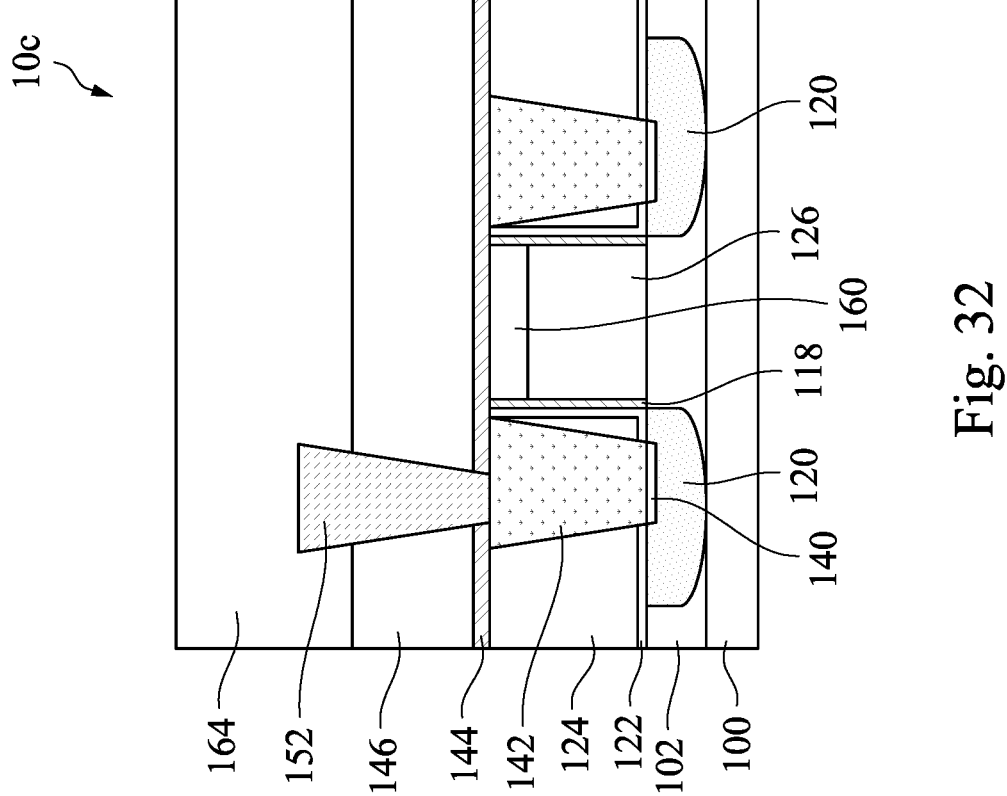
Figure 33:
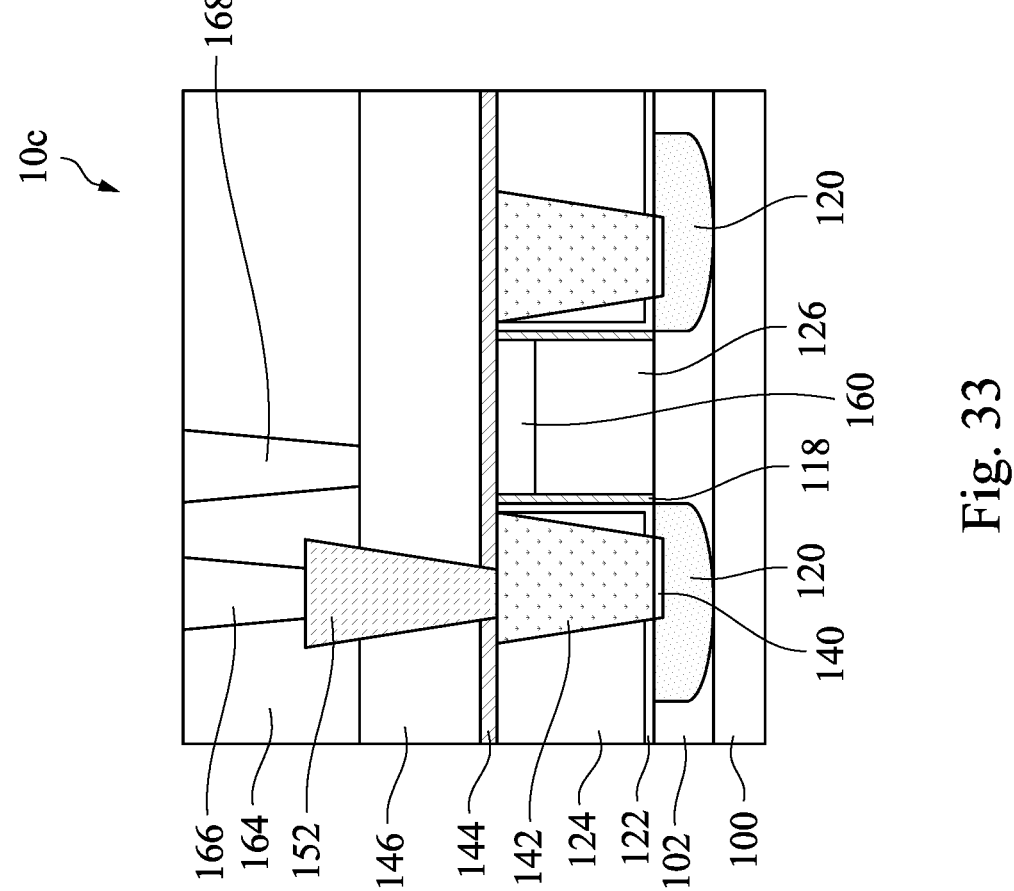

Reference is made to FIG. 32. After etching back the second ILD layer 146, an etch stop layer (not shown) and a first inter metal dielectric (IMD) layer 164 is formed over the second ILD layer 146. Then, a patterning operation is performed to form openings through the first IMD layer 164. Afterwards, a conductive material is deposited to fill the openings and over the first IMD layer 164, in which a single layer or a multilayer (including a plurality of conductive layers) is formed. Next, a planarization step such as CMP is performed to remove excess material of the conductive material on the first IMD layer 164, to planarize the top surface of the IC structure 10c. The remaining portion of the conductive material refers to metal lines 166 and 168. The resulting structure is shown in FIG. 33. The metal line 166 is over the via plug 152 and is electrically connected to the source/drain contact 142 through the via plug 152. The metal lines 166 and 168 may provide interconnection to one or more of the interconnect layers of a multilayer conductive element. The description herein is by separate via and metal trench process. In some other embodiments, via first or trench first dual damascene process may be applicable.

Figure 34:
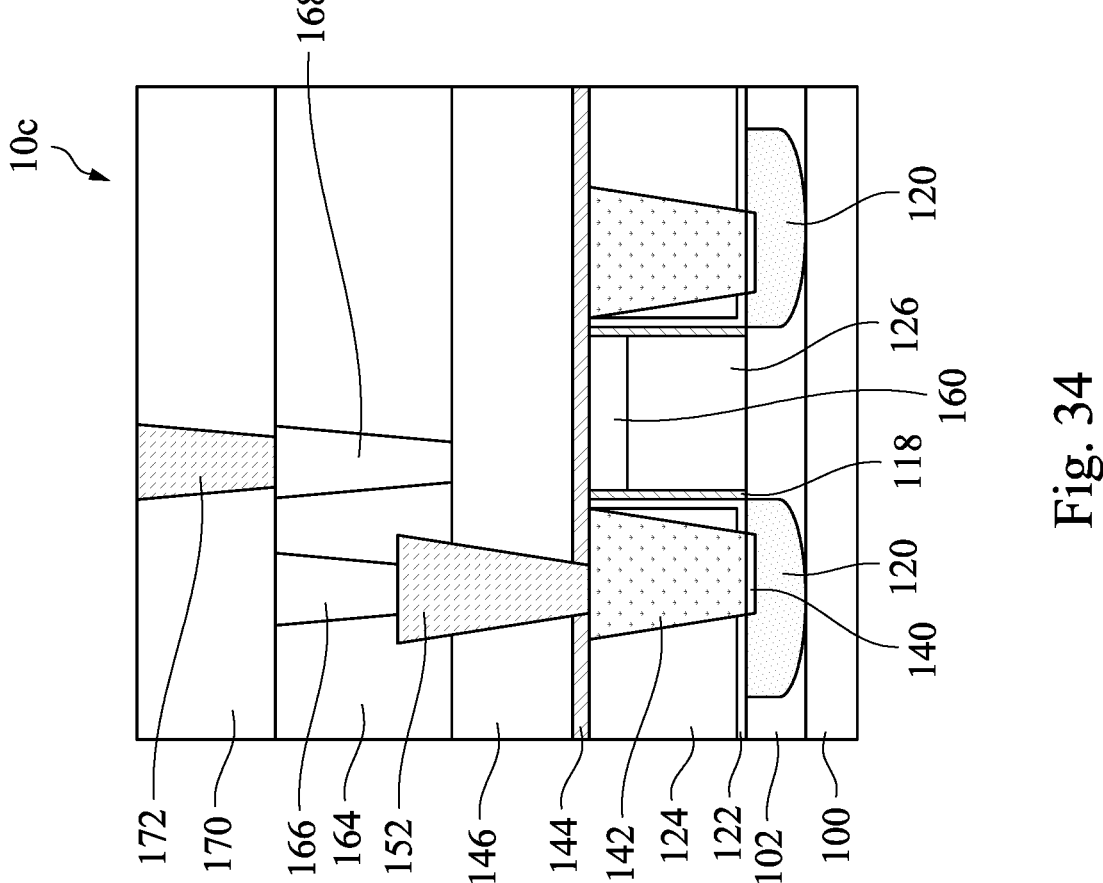

Reference is made to FIG. 34. An etch stop layer (not shown) and a second IMD layer 170 is formed on the first IMD layer 164. Then, a patterning operation is performed to form a via hole through the second IMD layer 170. The via hole is filled with one or more conductive materials so as to form the via plug 172 over the metal line 166. The via plug 172 may provide interconnection to one or more of the interconnect layers of a multilayer interconnect. The via plug 172 may include tungsten or other suitable conductive element. The description herein is by separate via and metal trench process. In some other embodiments, via first or trench first dual damascene process may be applicable.

It is understood that the IC structure 10c shown in FIG. 34 undergoes further CMOS processes to form various features such as interconnect metal layers, dielectric layers, passivation layers, etc.

Based on the above discussion, it can be seen that the present disclosure offers advantages. It is understood, however, that other embodiments may offer additional advantages, and not all advantages are necessarily disclosed herein. Moreover, no particular advantage is required for all embodiments. One advantage is that since the replacement gate structure is free from an overlying self-align contact (SAC), challenge for etching the via hole through the SAC can be prevented. Another advantage is that due to the wing parts of the gate spacer and the CESL, even if process variations lead to shifts in placements of the IC features, the replacement gate structure and the source/drain contacts are unlikely to be in physical contact, thereby preventing electrical shorting or leakage.

In some embodiments, a method of forming a semiconductor device includes forming a dummy gate structure across a fin protruding from a substrate, forming gate spacers on opposite sidewalls of the dummy gate structure, forming source/drain epitaxial structures on opposite sides of the dummy gate structure, forming a first interlayer dielectric (ILD) layer on the source/drain epitaxial structures and outer sidewalls of the gate spacers, replacing the dummy gate structure with a replacement gate structure, etching back the replacement gate structure to form a first recess between the gate spacers, forming a source/drain contact in the first ILD layer, and forming a second interlayer dielectric (ILD) layer to fill in the first recess between the gate spacers and over the source/drain contact. In some embodiments, forming the source/drain contact in the first ILD layer includes forming a patterned photoresist on the first ILD layer having an opening exposing a part of the first ILD layer on the source/drain epitaxial structures, removing the part of the first ILD layer to form a space, and filling the space with a conductive material. In some embodiments, the method further includes forming a hard mask layer on the replacement gate structure to fill the first recess before forming the source/drain contact in the first ILD layer. In some embodiments, the method further includes removing the hard mask layer after forming the source/drain contact in the first ILD layer to expose the replacement gate structure. In some embodiments, the method further includes forming an etch stop layer lining the first recess between the gate spacers. In some embodiments, the method further includes forming a contact etch stop layer (CESL) on the source/drain epitaxial structures and the outer sidewalls of the gate spacers, and after etching back the replacement gate structure, etching back the first ILD layer to form a second recess between the CESL. In some embodiments, the method further includes forming an etch stop layer to line the first recess and the second recess. In some embodiments, the method further includes etching back the source/drain contact before forming the etch stop layer. In some embodiments, the method further includes forming a hard mask layer on the replacement gate structure to fill the first recess after etching back the first ILD layer.

In some embodiments, a method of forming a semiconductor device includes forming a gate structure adjacent a source/drain epitaxial structure on a substrate, forming a source/drain contact on the source/drain epitaxial structure, forming a first interlayer dielectric (ILD) layer on the source/drain contact and the gate structure, forming a via plug in the first ILD layer, performing an etch back process such that the via plug has a top surface at a different height than a top surface of the first ILD layer, forming a second ILD layer on the first ILD layer, and forming metal lines in the second ILD layer, wherein one of the metal lines is in contact with the via plug. In some embodiments, performing the etch back process includes etching back the via plug such that the top surface of the via plug is at a height lower than a height of the top surface of the first ILD layer. In some embodiments, the second ILD layer has a portion between the one of the metal lines and the first ILD layer. In some embodiments, performing the etch back process includes etching back the first ILD layer such that the top surface of the first ILD layer is at a height lower than a height of the top surface of the via plug. In some embodiments, the second ILD layer surrounds a top portion of the via plug. In some embodiments, the via plug is in contact with the source/drain contact. In some embodiments, the via plug is in contact with the gate structure.

In some embodiments, a semiconductor device includes a fin extending in a first direction above a substrate, a gate structure across the fin and extending in a second direction substantially perpendicular to the first direction, gate spacers on opposite sides of the gate structure, respectively, source/drain regions adjacent the gate spacers, respectively, source/drain contacts on the source/drain regions, respectively, and an interlayer dielectric (ILD) layer over the gate structure and the source/drain contacts. The ILD layer has a portion extending between the gate spacers. In some embodiments, the semiconductor device further includes an etch stop layer extending across the gate structure and the gate spacers. The etch stop layer has a bottom surface higher over the gate spacers than over the gate structure. In some embodiments, each of the gate spacers has an inner sidewall having a lower region interfacing the gate structure and an upper region interfacing the etch stop layer. In some embodiments, a bottom surface of the ILD layer is lower on the gate structure than on the source/drain contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a dummy gate structure across a fin protruding from a substrate;
   forming gate spacers on opposite sidewalls of the dummy gate structure;
   forming source/drain epitaxial structures on opposite sides of the dummy gate structure;
   forming a first interlayer dielectric (ILD) layer on the source/drain epitaxial structures and outer sidewalls of the gate spacers;
   replacing the dummy gate structure with a replacement gate structure;
   etching back the replacement gate structure to form a first recess between the gate spacers;
   forming a source/drain contact in the first ILD layer; and
   forming a second interlayer dielectric (ILD) layer to fill in the first recess between the gate spacers and over the source/drain contact, wherein the source/drain contact has a top surface higher than a bottommost surface of the second ILD layer.

2. The method of claim 1, wherein forming the source/drain contact in the first ILD layer comprises:
   forming a patterned photoresist on the first ILD layer having an opening exposing a part of the first ILD layer on the source/drain epitaxial structures;
   removing the part of the first ILD layer to form a space; and
   filling the space with a conductive material.

3. The method of claim 1, further comprising:
   forming a hard mask layer on the replacement gate structure to fill the first recess before forming the source/drain contact in the first ILD layer.

4. The method of claim 3, further comprising:
   removing the hard mask layer after forming the source/drain contact in the first ILD layer to expose the replacement gate structure.

5. The method of claim 1, further comprising:
   forming an etch stop layer lining the first recess between the gate spacers.

6. The method of claim 1, further comprising:
   after etching back the replacement gate structure, forming a hard mask layer in the first recess; and
   removing the hard mask layer to expose the replacement gate structure.

7. The method of claim 1, wherein the source/drain contact has a bottom surface level with a bottom surface of the replacement gate structure.

8. The method of claim 1, further comprising:
   forming a first via plug over the source/drain contact, wherein the first via plug has a bottom surface higher than the bottommost surface of the second ILD layer.

9. The method of claim 8, further comprising:
   forming a second via plug over the replacement gate structure, wherein the first via plug and the second via plug have different heights along a vertical direction.

10. A method of forming a semiconductor device, comprising:
    forming a fin extending in a first direction above a substrate;
    forming a gate structure across the fin and extending in a second direction substantially perpendicular to the first direction;
    forming gate spacers on opposite sides of the gate structure, respectively, wherein the gate spacers and the gate structure have a recess between the gate spacers;
    forming source/drain regions adjacent the gate spacers, respectively;
    forming source/drain contacts on the source/drain regions, respectively, wherein the source/drain contacts have a top surface level with a top surface of the gate spacers;
    forming a first interlayer dielectric (ILD) layer over the gate structure and the source/drain contacts, the first ILD layer having a portion extending between the gate spacers; and
    forming a second interlayer dielectric (ILD) layer to fill in the recess between the gate spacers and over the source/drain contacts, wherein the source/drain contacts have the top surface higher than a bottommost surface of the second ILD layer.

11. The method of claim 10, further comprising:
    forming an etch stop layer extending across the gate structure and the gate spacers, wherein the etch stop layer has a bottom surface higher over the gate spacers than over the gate structure.

12. The method of claim 11, wherein each of the gate spacers has an inner sidewall having a lower region interfacing the gate structure and an upper region interfacing the etch stop layer.

13. The method of claim 10, wherein a bottom surface of the first ILD layer is lower on the gate structure than on the source/drain contacts.

14. The method of claim 10, further comprising:
    forming a silicide region over one of the source/drain regions, the silicide region has a bottom surface lower than a bottom surface of the gate structure.

15. A method of forming a semiconductor device, comprising:
    forming source/drain epitaxial structures over a substrate;
    forming a first interlayer dielectric (ILD) layer over the source/drain epitaxial structures;
    forming a gate structure over the substrate, wherein the source/drain epitaxial structures are on opposites sides of the gate structure;

forming gate spacers on opposite sides of the gate structure, respectively, wherein the gate spacers and the gate structure have a recess between the gate spacers;

forming source/drain contacts over the source/drain epitaxial structures; and after forming the source/drain contacts over the source/drain epitaxial structures, forming a second interlayer dielectric (ILD) layer over the first ILD layer, wherein the second ILD layer has a bottom surface lower than a top surface of the first ILD layer, and wherein forming the second ILD layer comprises:

forming the second ILD layer to fill in the recess between the gate spacers and over the source/drain contacts, wherein the source/drain contacts have a top surface higher than a bottommost surface of the second ILD layer.

16. The method of claim 15, further comprising:

an etch stop layer over the first ILD layer, wherein the etch stop layer has a bottom surface lower than the top surface of the first ILD layer.

17. The method of claim 16, wherein the etch stop layer and the second ILD layer have a first interface lower than the top surface of one of the source/drain contacts.

18. The method of claim 17, wherein the etch stop layer and the second ILD layer have a second interface higher than the top surface of the source/drain contact.

19. The method of claim 17, wherein the gate structure has a vertical thickness smaller than a vertical thickness of the source/drain contact.

20. The method of claim 15, further comprising:

forming an etch stop layer over the source/drain contacts, wherein one of the source/drain contacts is in contact with the etch stop layer.

\* \* \* \* \*